US012727326B2

(12) United States Patent
Choi et al.

(10) Patent No.: US 12,727,326 B2
(45) Date of Patent: Sep. 1, 2026

(54) DISPLAY APPARATUS AND METHOD OF MANUFACTURING THE SAME

(71) Applicant: SAMSUNG DISPLAY CO., LTD., Yongin-si (KR)

(72) Inventors: Wonwoo Choi, Yongin-si (KR); Yoonah Choi, Yongin-si (KR); Donghun Nam, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 874 days.

(21) Appl. No.: 17/976,301

(22) Filed: Oct. 28, 2022

(65) Prior Publication Data

US 2023/0232662 A1 Jul. 20, 2023

(30) Foreign Application Priority Data

Jan. 20, 2022 (KR) ........................ 10-2022-0008522

(51) Int. Cl.
*H10K 59/121* (2023.01)
*H10D 86/40* (2025.01)
(Continued)

(52) U.S. Cl.
CPC ....... *H10K 59/1213* (2023.02); *H10D 86/423* (2025.01); *H10D 86/60* (2025.01);
(Continued)

(58) Field of Classification Search
None
See application file for complete search history.

(56) References Cited

U.S. PATENT DOCUMENTS 6,380,558 B1 * 4/2002 Yamazaki .......... H10D 30/0316 257/E21.414
9,343,586 B2 5/2016 Goto et al.
(Continued)

FOREIGN PATENT DOCUMENTS

CN 1396626 A * 2/2003 ......... H01L 21/0237
CN 102124137 A * 7/2011 ......... C23C 14/5853
(Continued)

OTHER PUBLICATIONS

Google Search—Tensile Strength of Metals, Nov. 25, 2025 (Year: 2025).*

*Primary Examiner* — Michael Lebentritt
(74) *Attorney, Agent, or Firm* — CANTOR COLBURN LLP

(57) ABSTRACT

A display apparatus includes a substrate, a first semiconductor layer disposed on the substrate, a second semiconductor layer disposed on the first semiconductor layer, an interlayer insulating layer disposed on the second semiconductor layer and including a plurality of inorganic insulating layers, a source electrode or a drain electrode disposed on the interlayer insulating layer and respectively connected to the first semiconductor layer or the second semiconductor layer, and an organic light emitting element connected to the source electrode or the drain electrode, where the plurality of inorganic insulating layers include an oxide layer, a first nitride layer disposed on the oxide layer and having a first density, and a second nitride layer disposed on the first nitride layer and having a second density lower than the first density.

16 Claims, 12 Drawing Sheets

(51) Int. Cl.

| | |
|---|---|
| ***H10D 86/60*** | (2025.01) |
| ***H10K 50/844*** | (2023.01) |
| ***H10K 59/12*** | (2023.01) |
| ***H10K 59/131*** | (2023.01) |
| ***H10K 71/00*** | (2023.01) |

(52) U.S. Cl.

CPC ....... *H10K 50/844* (2023.02); *H10K 59/1201* (2023.02); *H10K 59/131* (2023.02); *H10K 71/00* (2023.02)

(56) References Cited

U.S. PATENT DOCUMENTS

| | | | | |
|---|---|---|---|---|
| 9,715,997 | B2 | 7/2017 | Choi et al. | |
| 9,947,797 | B2 | 4/2018 | Yamazaki et al. | |
| 11,393,888 | B2 | 7/2022 | Han et al. | |
| 11,502,110 | B2 | 11/2022 | Seo et al. | |
| 2018/0277614 | A1 | 9/2018 | Ono et al. | |
| 2019/0131550 | A1 | 5/2019 | Qin | |
| 2021/0141422 | A1 | 5/2021 | Seo et al. | |
| 2022/0208868 | A1* | 6/2022 | Lee | H10K 59/124 |
| 2023/0217800 | A1* | 7/2023 | Lee | G06F 1/1601<br>257/40 |

FOREIGN PATENT DOCUMENTS

| | | | |
|---|---|---|---|
| KR | 102177209 | B1 | 2/2015 |
| KR | 1020150113828 | A | 10/2015 |
| KR | 101648684 | B1 | 8/2016 |
| KR | 101986617 | B1 | 6/2019 |
| KR | 102017085 | B1 | 10/2019 |
| KR | 102190248 | B1 | 12/2020 |
| KR | 1020200143562 | A | 12/2020 |
| KR | 1020210117389 | A | 9/2021 |

* cited by examiner

Figure 10:
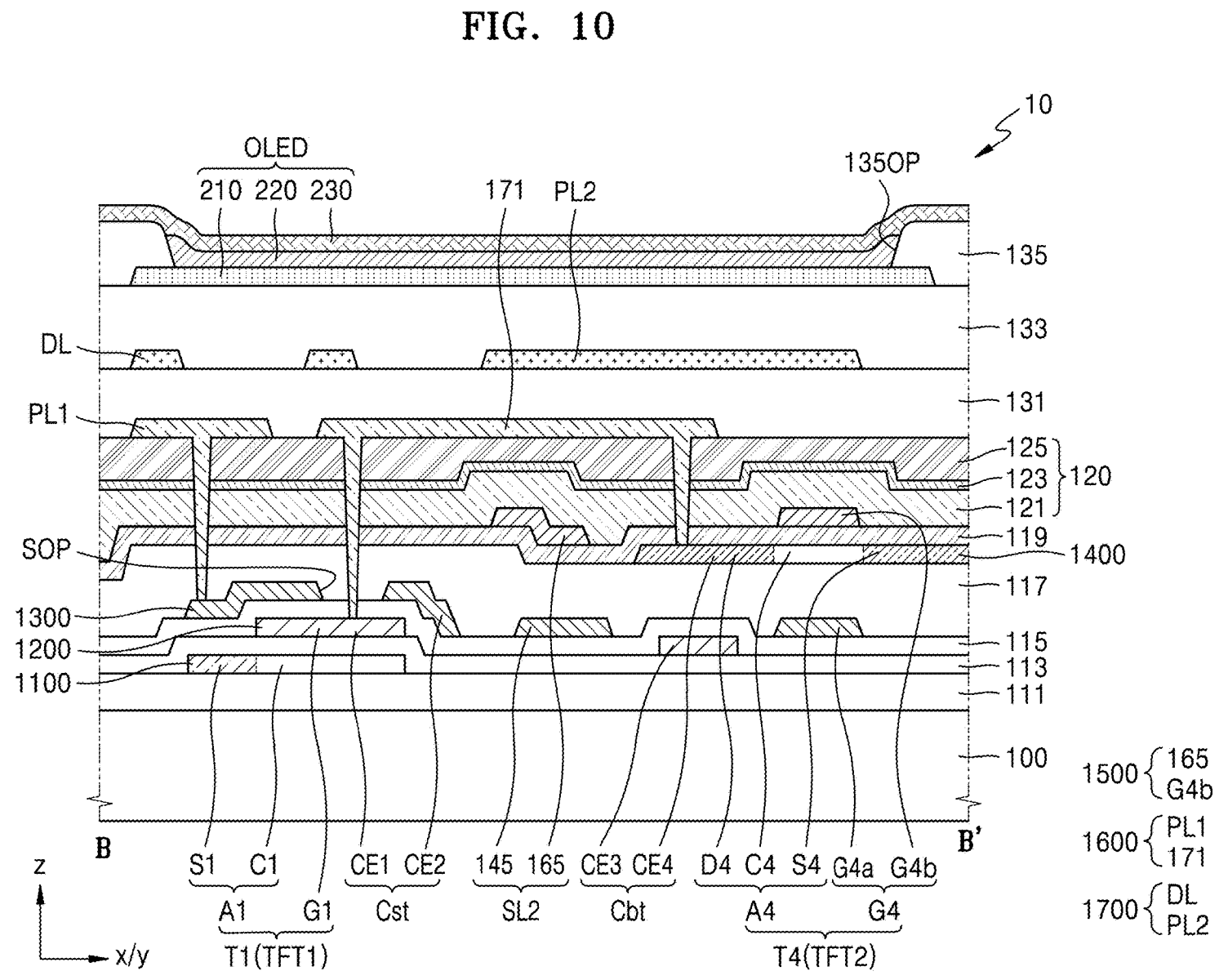

10
135OP
135
133
131
125
123
121
120
119
1400
117
115
113
111
100
B'
B
OLED
210 220 230
171 PL2
DL
PL1
SOP
1300
1200
1100
S1 C1 G1 CE1 CE2 145 165 CE3 CE4 D4 C4 S4 G4a G4b
A1 Cst SL2 Cbt A4 G4
T1(TFT1) T4(TFT2)
1500 {165, G4b}
1600 {PL1, 171}
1700 {DL, PL2}
z
x/y

DISPLAY APPARATUS AND METHOD OF MANUFACTURING THE SAME

This application claims priority to Korean Patent Application No. 10-2022-0008522, filed on Jan. 20, 2022, and all the benefits accruing therefrom under 35 U.S.C. § 119, the content of which in its entirety is herein incorporated by reference.

BACKGROUND

1. Field

One or more embodiments relate to a display apparatus and a method of manufacturing the display apparatus, and more particularly, to a display apparatus capable of implementing a clear image even after an external impact is applied thereto and a method of manufacturing the display apparatus.

2. Description of the Related Art

Mobile (or portable) electronic apparatuses have been widely used. Recently, in addition to small electronic apparatuses such as mobile phones, tablet personal computers (PCs) have been widely used as mobile electronic apparatuses.

Such mobile electronic apparatuses include a display apparatus to provide visual information such as images or videos to a user to support various functions. Recently, as other components for driving a display apparatus have been miniaturized, the proportion of an electronic apparatus occupied by a display apparatus has increased gradually and a structure capable of being bent from a flat state to have a certain angle has also been developed.

SUMMARY

When an object falls and collides with an upper surface of a display apparatus, some of the internal layers thereof may be broken or damaged and accordingly some of the pixels of the display apparatus may not operate and thus a dark spot may occur. Particularly, this problem may frequently occur in a display apparatus that may be freely changed in shape. One or more embodiments include a display apparatus capable of implementing a clear image even after an external impact is applied thereto.

According to one or more embodiments, a display apparatus includes a substrate, a first semiconductor layer disposed on the substrate, a second semiconductor layer disposed on the first semiconductor layer, an interlayer insulating layer disposed on the second semiconductor layer and including a plurality of inorganic insulating layers, a source electrode or a drain electrode disposed on the interlayer insulating layer and respectively connected to the first semiconductor layer or the second semiconductor layer, and an organic light emitting element connected to the source electrode or the drain electrode, where the plurality of inorganic insulating layers include an oxide layer, a first nitride layer disposed on the at least one oxide layer and having a first density, and a second nitride layer disposed on the first nitride layer and having a second density lower than the first density.

In an embodiment, a hydrogen content of the first nitride layer may be lower than a hydrogen content of the second nitride layer.

In an embodiment, the first nitride layer may have a compressive stress, and the second nitride layer may have a tensile stress.

In an embodiment, a thickness of the first nitride layer may be less than a thickness of the oxide layer.

In an embodiment, the thickness of the first nitride layer may be less than a thickness of the second nitride layer.

In an embodiment, a thickness of the interlayer insulating layer may be in a range of about 5500 angstrom (Å) to about 7500 Å, and the thickness of the first nitride layer may be in a range of about 400 Å to about 600 Å.

In an embodiment, the plurality of inorganic insulating layers may further include a third nitride layer arranged between the first nitride layer and the second nitride layer, and the third nitride layer may have a third density lower than the first density and higher than the second density.

In an embodiment, a hydrogen content of the third nitride layer may be higher than a hydrogen content of the first nitride layer and may be lower than a hydrogen content of the second nitride layer.

In an embodiment, the display apparatus may further include a first metal layer disposed on the first semiconductor layer, a second metal layer arranged between the first metal layer and the second semiconductor layer, and a third metal layer arranged therebetween the second semiconductor layer and the interlayer insulating layer, where at least one selected from the first to third metal layers may have a compressive stress or a tensile stress of about 200 megapascals (MPa) or less.

According to one or more embodiments, a method of manufacturing a display apparatus includes providing a first semiconductor layer on a substrate, forming a second semiconductor layer on the first semiconductor layer, and providing an interlayer insulating layer including a plurality of inorganic insulating layers on the second semiconductor layer, where the providing the interlayer insulating layer includes providing an oxide layer on the second semiconductor layer, providing a first nitride layer having a first density on the oxide layer, and providing a second nitride layer having a second density lower than the first density on the first nitride layer.

In an embodiment, a hydrogen partial pressure in a chamber used in the providing the first nitride layer may be lower than a hydrogen partial pressure in the chamber used in the providing the second nitride layer.

In an embodiment, the first nitride layer may have a thickness in a range of about 400 Å to about 600 Å.

In an embodiment, the interlayer insulating layer may have a thickness in a range of about 5500 Å to about 7500 Å.

In an embodiment, the method may further include providing a third nitride layer having a third density lower than the first density and higher than the second density between the providing the first nitride layer and the providing the second nitride layer.

In an embodiment, a hydrogen partial pressure in a chamber used in the providing the third nitride layer may be higher than a hydrogen partial pressure in the chamber in the forming of the first nitride layer and may be lower than a hydrogen partial pressure in the chamber used in the providing the second nitride layer.

In an embodiment, the method may further include providing a first metal layer on the first semiconductor layer between the providing the first semiconductor layer and the providing the second semiconductor layer, providing a second metal layer on the first metal layer, and providing a third metal layer on the second semiconductor layer between the providing the second semiconductor layer and the providing the interlayer insulating layer.

In an embodiment, at least one selected from the first to third metal layers may have a compressive stress or a tensile stress of about 200 MPa or less.

In an embodiment, at least one selected from the providing the first metal layer, the providing the second metal layer, and providing the third metal layer may be performed by using a rotary type sputtering device including a plurality of cylindrical targets.

In an embodiment, the plurality of cylindrical targets may be arranged apart from each other with a ground portion therebetween.

In an embodiment, the substrate may be disposed on a stage, and a difference between a height from an upper surface of the stage to a top surface of the interlayer insulating layer, which is measured at a center portion of the substrate, and a height from the upper surface of the stage to the top surface of the interlayer insulating layer, which is measured at an edge portion of the substrate, may be about 150 micrometers (μm) or less.

These general and particular embodiments may be implemented by using systems, methods, computer programs, or any combinations of systems, methods, and computer programs.

BRIEF DESCRIPTION OF THE DRAWINGS

The above and other features of certain embodiments of the disclosure will be more apparent from the following description taken in conjunction with the accompanying drawings, in which:

FIG. 6 is a cross-sectional view schematically illustrating a display apparatus according to an embodiment;

FIG. 7 is a cross-sectional view schematically illustrating a display apparatus according to an alternative embodiment;

FIGS. 8 to 10 are cross-sectional views sequentially illustrating a method of manufacturing a display apparatus according to an embodiment;

DETAILED DESCRIPTION

Figure 1:
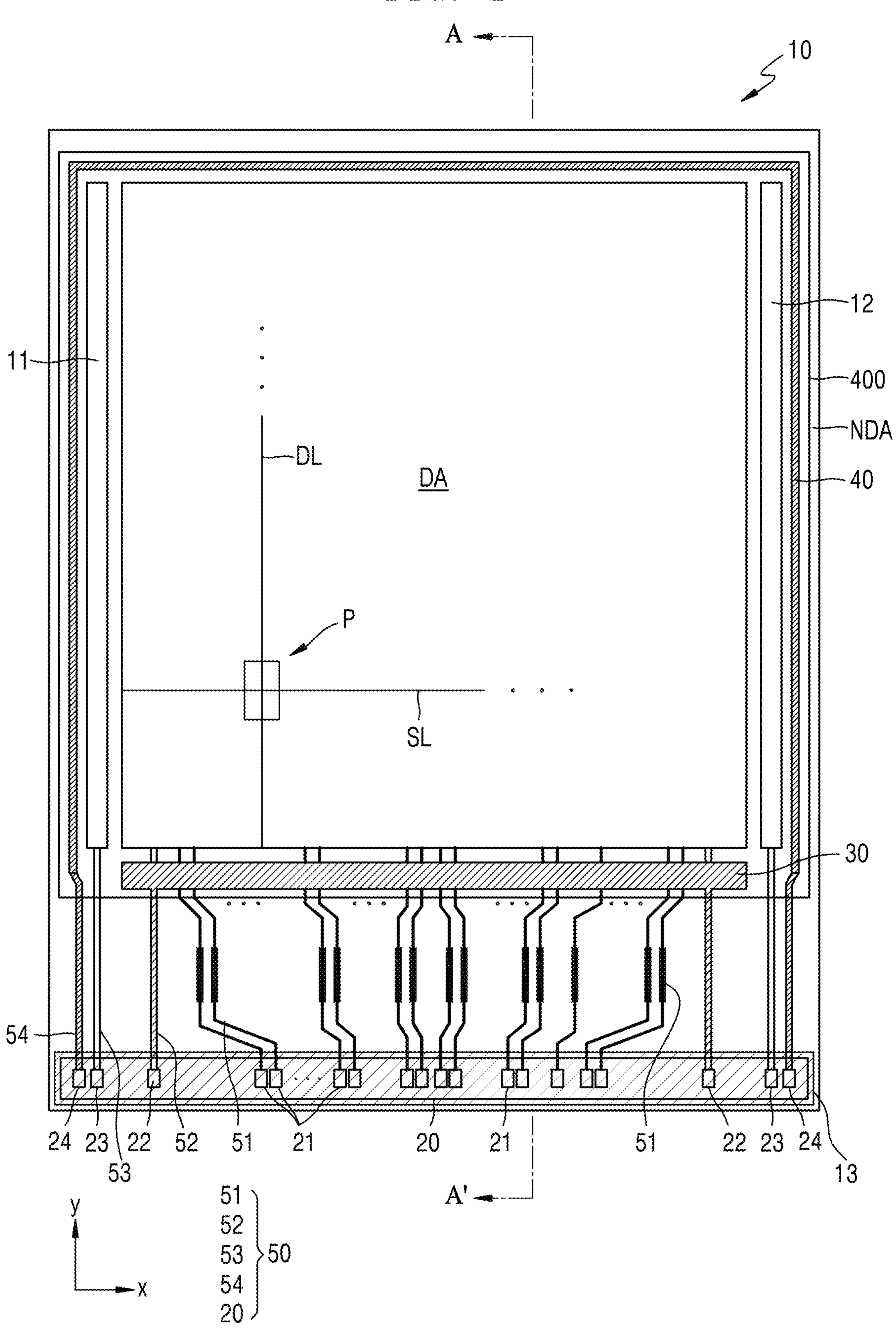
FIG. 1 is a plan view schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

It will be understood that although terms such as "first" and "second" may be used herein to describe various components, these components should not be limited by these terms and these terms are only used to distinguish one component from another component.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an."

Also, it will be understood that the terms "comprise," "include," and "have" used herein specify the presence of stated features or components, but do not preclude the presence or addition of one or more other features or components.

It will be understood that when a layer, region, or component is referred to as being "on" another layer, region, or component, it may be "directly on" the other layer, region, or component or may be "indirectly on" the other layer, region, or component with one or more intervening layers, regions, or components therebetween.

It will be understood that when a layer, region, or component is referred to as being "connected to" another layer, region, or component, it may be "directly connected to" the other layer, region, or component or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component and/or may be "indirectly electrically connected to" the other layer, region, or component with one or more intervening layers, regions, or components therebetween.

"Or" means "and/or." As used herein, "A and/or B" represents the case of A, B, or A and B. Also, "at least one of A and B" represents the case of A, B, or A and B. Throughout the disclosure, the expression "at least one of a, b or c" or "at least one selected from a, b and c" indicates only a, only b, only c, both a and b, both a and c, both b and c, all of a, b, and c, or variations thereof.

As used herein, x-axis, y-axis, and z-axis are not limited to three axes of the rectangular coordinate system, and may be interpreted in a broader sense. For example, the x-axis, the y-axis, and the z-axis may be perpendicular to one another or may represent different directions that are not perpendicular to one another. Herein, directions of x-axis, y-axis, and z-axis may be referred to as x direction, y direction and z direction, respectively.

When a certain embodiment may be implemented differently, a particular process order may be performed differently from the described order. For example, two consecutively described processes may be performed substantially at the same time or may be performed in an order opposite to the described order.

Furthermore, relative terms, such as “lower” or “bottom” and “upper” or “top,” may be used herein to describe one element’s relationship to another element as illustrated in the Figures. It will be understood that relative terms are intended to encompass different orientations of the device in addition to the orientation depicted in the Figures. For example, if the device in one of the figures is turned over, elements described as being on the “lower” side of other elements would then be oriented on “upper” sides of the other elements. The term “lower,” can therefore, encompasses both an orientation of “lower” and “upper,” depending on the particular orientation of the figure. Similarly, if the device in one of the figures is turned over, elements described as “below” or “beneath” other elements would then be oriented “above” the other elements. The terms “below” or “beneath” can, therefore, encompass both an orientation of above and below.

Sizes of elements in the drawings may be exaggerated for convenience of description. In other words, because the sizes and thicknesses of elements in the drawings are arbitrarily illustrated for convenience of description, the disclosure is not limited thereto.

“About” or “approximately” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described in detail with reference to the accompanying drawings, and in the following description, like reference numerals will denote like elements and redundant descriptions thereof will be omitted for conciseness.

Figure 2:
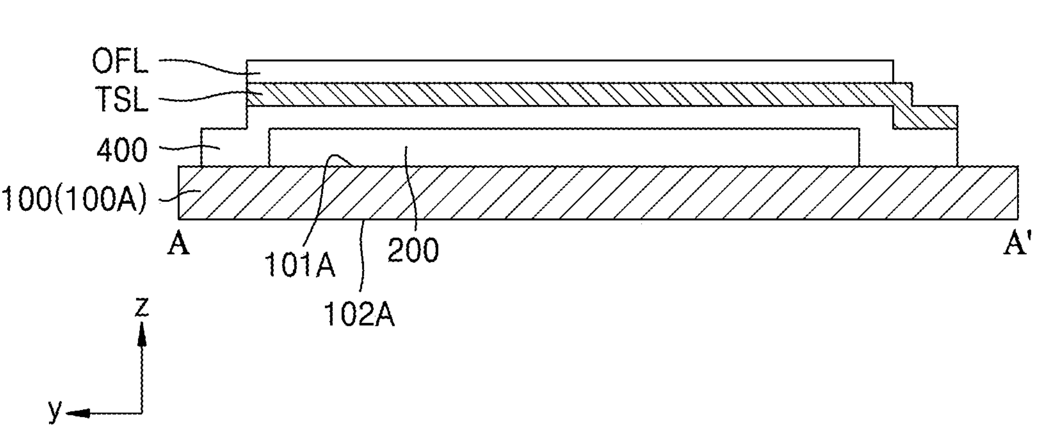
FIG. 2 is a cross-sectional view illustrating a portion of a display apparatus according to an embodiment.
Figure 3:
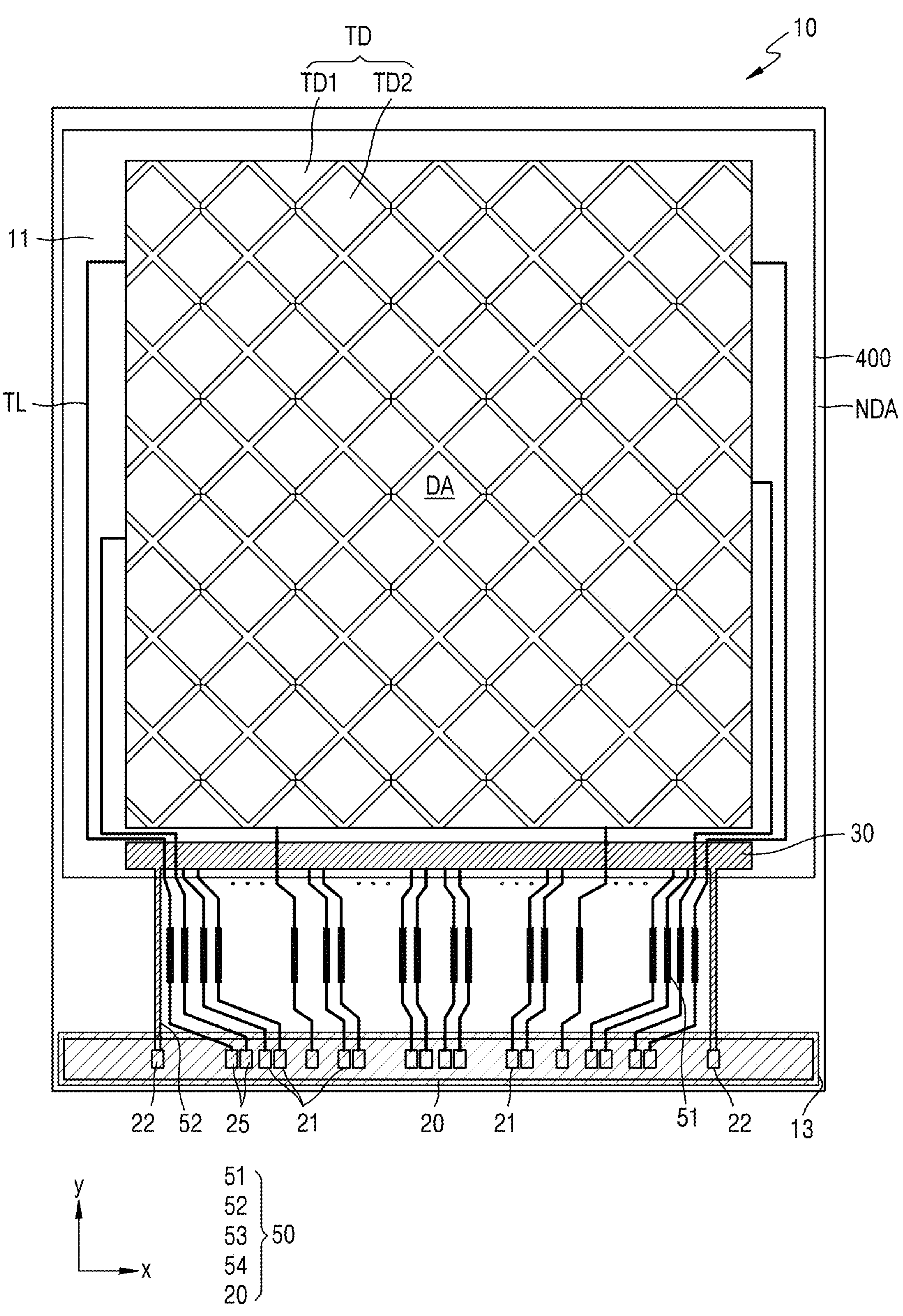
FIG. 3 is a plan view schematically illustrating a display apparatus according to an embodiment.

FIG. 1 is a plan view schematically illustrating a display apparatus according to an embodiment. FIG. 2 is a cross-sectional view illustrating a portion of a display apparatus according to an embodiment, which corresponds to a cross-sectional view of the display apparatus taken along line A-A' of FIG. 1. FIG. 3 is a plan view schematically illustrating a display apparatus according to an embodiment.

Referring to FIGS. 1 to 3, an embodiment of a display apparatus 10 may include a display area DA and a peripheral area NDA. The display area DA may be an area in which pixels P are arranged. The display area DA may provide an image by using light emitted from each of the pixels P. The pixel P may be connected to a signal line such as a scan line SL extending in the x direction and a data line DL extending in the y direction. Although not illustrated in FIG. 1, the pixel P may be connected to power lines configured to transmit a direct current (DC) signal, such as a driving power line and a common power line. The display area DA may be covered with a thin film encapsulation layer 400 overlapping a substrate 100.

The pixel P may include a pixel circuit electrically connected to the signal line and the power line described above and a display element such as an organic light emitting diode (OLED) in the pixel circuit. The pixel P may emit, for example, red, green, blue, or white light through the organic light emitting element.

The peripheral area NDA may include a first scan driver 11, a second scan driver 12, a terminal unit 20, a driving voltage supply line 30, a common voltage supply line 40, and a line layer 50. The peripheral area NDA may be an area in which no pixels are arranged.

The first scan driver 11 and the second scan driver 12 may be arranged in the peripheral area NDA. The first scan driver 11 and the second scan driver 12 may be spaced apart from each other with the display area DA therebetween. The first scan driver 11 and/or the second scan driver 12 may generate and transmit a scan signal to each pixel P through the scan line SL. Although FIG. 1 illustrates an embodiment where two scan drivers are arranged, the disclosure is not limited thereto. In an alternative embodiment, a single scan driver may be arranged on one side of the display area DA.

The terminal unit 20 may be arranged at one end portion of the peripheral area NDA and may include terminals 21, 22, 23, and 24. The terminal unit 20 may be exposed, by not being covered by an insulating layer, to be connected to a driver integrated circuit (IC) 13. The driver IC 13 may include a data driver.

The driving voltage supply line 30 may be configured to provide a driving voltage to the pixels P. The driving voltage supply line 30 may be arranged in the peripheral area NDA to be adjacent to one side of the display area DA.

The common voltage supply line 40 may be configured to provide a common voltage to the pixels P. The common voltage may be a voltage applied to a cathode electrode of the organic light emitting element, and the common voltage supply line 40 may be arranged in the peripheral area NDA to partially surround the display area DA.

A first line 51, a second line 52, a third line 53, and a fourth line 54 of the line layer 50 may be arranged between one end portion of the display area DA and the terminal unit 20 and may extend in the y direction. The first line 51 may electrically connect the signal line of the display area DA to the terminal unit 20, and the second line 52 may electrically connect the driving voltage supply line 30 to the terminal unit 20. The third line 53 may electrically connect each of the first scan driver 11 and the second scan driver 12 to the terminal unit 20, and the fourth line 54 may electrically connect the common voltage supply line 40 to the terminal unit 20.

In FIG. 1, the terminals 21, 22, 23, and 24 of the terminal unit 20 are assigned different reference numerals than the first line 51, the second line 52, the third line 53, and the fourth line 54; however, the terminals 21, 22, 23, and 24 may be defined by portions of the first line 51, the second line 52, the third line 53, and the fourth line 54 respectively. That is, an end portion of the first line 51 may correspond to the terminal 21, an end portion of the second line 52 may correspond to the terminal 22, an end portion of the third line 53 may correspond to the terminal 23, and an end portion of the fourth line 54 may correspond to the terminal 24.

In an embodiment of the display apparatus 10, a display layer 200 may be disposed on a substrate 100. The display layer 200 may include a plurality of pixels. In such an embodiment, each pixel may include a display element and a pixel circuit for operating the display element, such that the display layer 200 may include a plurality of display elements and pixel circuits respectively connected to the display elements.

The display layer 200 may be shielded by the thin film encapsulation layer 400. The thin film encapsulation layer 400 may include at least one organic encapsulation layer and at least one inorganic encapsulation layer. The at least one organic encapsulation layer and the at least one inorganic encapsulation layer may be alternately stacked one on another. An input sensing member TSL and an optical functional member OFL may be disposed on the thin film encapsulation layer 400.

The input sensing member TSL may include a touch electrode TD of various patterns for a touch screen function. The touch electrode TD may include first touch electrodes TD1 connected to each other in a first direction (x direction) and second touch electrodes TD2 connected to each other in a second direction (y direction) intersecting with the first direction.

The touch electrode TD may include or be provided as a transparent electrode material such that the light from the emission area of pixels arranged under the input sensing member TSL may be transmitted therethrough. Alternatively, the touch electrode TD may be provided in a mesh shape such that the light from the emission area of the pixels may be transmitted therethrough. In such an embodiment, the touch electrode TD is not limited to a transparent electrode material. In an embodiment, for example, the touch electrode TD may be defined by a single layer or multiple layers, each layer therein including or formed of a conductive material including aluminum (Al), copper (Cu), and/or titanium (Ti).

The touch electrode TD may be connected to a touch line TL for transmitting a signal sensed by the touch electrode TD, and the touch line TL may extend from an upper portion of the thin film encapsulation layer 400 to the peripheral area NDA along one side surface of the thin film encapsulation layer 400.

The touch line TL may be connected to the touch electrode TD of the input sensing member TSL of the display area DA and may extend from an upper portion of the thin film encapsulation layer 400. The touch line TL may be connected to a touch terminal 25 of the terminal unit 20 to exchange electrical signals with the input sensing member TSL.

The optical functional member OFL may reduce the reflectance of light (external light) incident from the outside toward the display apparatus 10 and/or may improve the color purity of light emitted from the display apparatus 10.

In an embodiment, the optical functional member OFL may include a phase retarder and a polarizer. The phase retarder may be a film type or a liquid crystal coating type and may include a λ/2 phase retarder and/or a λ/4 phase retarder. The polarizer may also be a film type or a liquid crystal coating type. The film type may include a stretched synthetic resin film, and the liquid crystal coating type may include liquid crystals arranged in a certain arrangement.

In an alternative embodiment, the optical functional member OFL may include a black matrix and color filters. The color filters may be arranged considering the color of light emitted from each of the pixels of the display apparatus 10. Each of the color filters may include a red, green, or blue pigment or dye. Alternatively, each of the color filters may further include quantum dots in addition to the above pigment or dye. Alternatively, some of the color filters may not include the above pigment or dye and may include scattering particles such as titanium oxide.

In another alternative embodiment, the optical functional member OFL may include a destructive interference structure. The destructive interference structure may include a first reflection layer and a second reflection layer arranged on different layers. First reflected light and second reflected light respectively reflected by the first reflection layer and the second reflection layer may destructively interfere with each other, and accordingly, the external light reflectance may be reduced.

Figure 4:
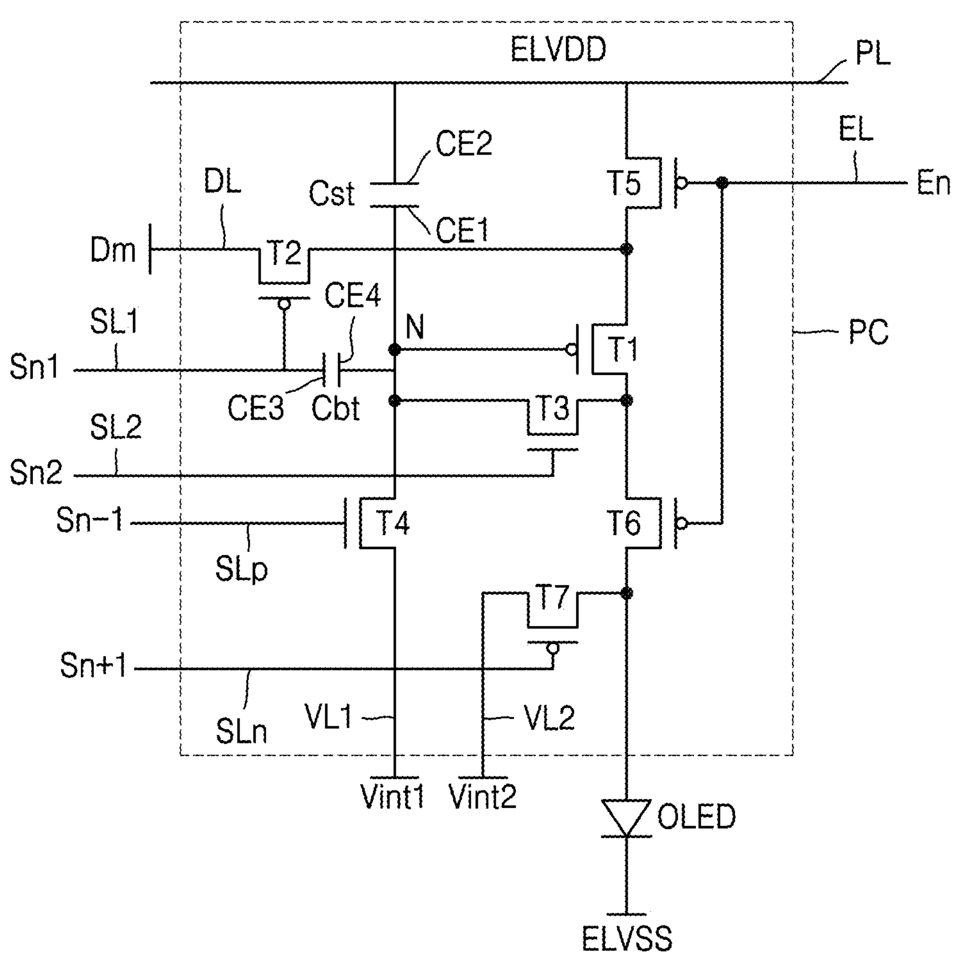
FIG. 4 is an equivalent circuit diagram of a pixel circuit for driving a pixel according to an embodiment.

FIG. 4 is an equivalent circuit diagram of a pixel circuit for driving a pixel according to an embodiment.

An embodiment of the pixel circuit PC may include a driving thin film transistor T1, a switching thin film transistor T2, a compensation thin film transistor T3, a first initialization thin film transistor T4, an operation control thin film transistor T5, an emission control thin film transistor T6, a second initialization thin film transistor T7, a first storage capacitor Cst, and a second storage capacitor Cbt. In such an embodiment, the pixel circuit PC may be connected to a plurality of signal lines, first and second initialization voltage lines VL1 and VL2, and a driving voltage line PL. The signal lines may include a data line DL, a first scan line SL1, a second scan line SL2, a previous scan line SLp, a next scan line SLn, and an emission control line EL. In an embodiment, at least one selected from the signal lines, the first and second initialization voltage lines VL1 and VL2, and/or the driving voltage line PL may be shared by adjacent pixel circuits.

The driving voltage line PL may be configured to transmit a first power voltage ELVDD to the driving thin film transistor T1. The first initialization voltage line VL1 may be configured to transmit a first initialization voltage Vint1 for initializing the driving thin film transistor T1 to the pixel circuit PC. The second initialization voltage line VL2 may be configured to transmit a second initialization voltage Vint2 for initializing an organic light emitting diode OLED to the pixel circuit PC.

In an embodiment, among the driving thin film transistor T1, the switching thin film transistor T2, the compensation thin film transistor T3, the first initialization thin film transistor T4, the operation control thin film transistor T5, the emission control thin film transistor T6 and the second initialization thin film transistor T7, the compensation thin film transistor T3 and the first initialization thin film transistor T4 may be implemented as an n-channel metal oxide semiconductor field effect transistor (MOSFET) (NMOS), and the other thin film transistors may be implemented as a p-channel MOSFET (PMOS).

The drain area of the driving thin film transistor T1 may be electrically connected to the organic light emitting diode OLED via the emission control thin film transistor T6. The driving thin film transistor T1 may receive a data signal Dm according to a switching operation of the switching thin film transistor T2 and supply a driving current to the organic light emitting diode OLED.

The switching thin film transistor T2 may be turned on in response to a first scan signal Sn1 received through the first scan line SL1, to perform a switching operation of transmitting the data signal Dm transmitted to the data line DL to the source area of the driving thin film transistor T1.

The gate electrode of the compensation thin film transistor T3 may be connected to the second scan line SL2. The source area of the compensation thin film transistor T3 may be connected to the pixel electrode of the organic light emitting diode OLED via the emission control thin film transistor T6 while being connected to the drain area of the driving thin film transistor T1. The drain area of the compensation thin film transistor T3 may be connected to any one electrode of the first storage capacitor Cst, the source area of the first initialization thin film transistor T4, and the gate electrode of the driving thin film transistor T1. The compensation thin film transistor T3 may be turned on in response to a second scan signal Sn2 received through the second scan line SL2, to connect the gate electrode and the drain area of the driving thin film transistor T1 to each other to diode-connect the driving thin film transistor T1.

The gate electrode of the first initialization thin film transistor T4 may be connected to the previous scan line SLp. The drain area of the first initialization thin film transistor T4 may be connected to the first initialization voltage line VL1. The source area of the first initialization thin film transistor T4 may be connected to any one electrode of the first storage capacitor Cst, the drain area of the compensation thin film transistor T3, and the gate electrode of the driving thin film transistor T1. The first initialization thin film transistor T4 may be turned on in response to a previous scan signal Sn−1 received through the previous scan line SLp, to perform an initialization operation of initializing the voltage of the gate electrode of the driving thin film transistor T1 by transmitting the first initialization voltage Vint1 to the gate electrode of the driving thin film transistor T1.

The gate electrode of the second initialization thin film transistor T7 may be connected to the next scan line SLn. The source area of the second initialization thin film transistor T7 may be connected to the pixel electrode of the organic light emitting diode OLED. The drain area of the second initialization thin film transistor T7 may be connected to the second initialization voltage line VL2. The second initialization thin film transistor T7 may initialize the pixel electrode of the organic light emitting diode OLED by being turned on in response to a next scan signal Sn+1 received through the next scan line SLn.

The first storage capacitor Cst may include a first electrode CE1 and a second electrode CE2. The first electrode CE1 may be connected to the gate electrode of the driving thin film transistor T1, and the second electrode CE2 may be connected to the driving voltage line PL. The first storage capacitor Cst may be configured to store and maintain a voltage corresponding to the voltage difference between both ends of the gate electrode of the driving thin film transistor T1 and the driving voltage line PL to maintain a voltage applied to the gate electrode of the driving thin film transistor T1.

The second storage capacitor Cbt may include a third electrode CE3 and a fourth electrode CE4. The third electrode CE3 may be connected to the first scan line SL1 and the gate electrode of the switching thin film transistor T2. The fourth electrode CE4 may be connected to the gate electrode of the driving thin film transistor T1 and the first electrode CE1 of the first storage capacitor Cst. As a boosting capacitor, the second storage capacitor Cbt may increase a voltage of a node N to decrease a voltage representing black when the first scan signal Sn1 of the first scan line SL1 is a voltage for turning off the switching thin film transistor T2.

An operation of the pixel circuit PC according to an embodiment will hereinafter be described in detail.

In a first initialization period, when the previous scan signal Sn−1 is supplied through the previous scan line SLp, the first initialization thin film transistor T4 may be turned on in response to the previous scan signal Sn−1 and the driving thin film transistor T1 may be initialized by the first initialization voltage Vint1 supplied from the first initialization voltage line VL1.

In a data programming period, when the first scan signal Sn1 and the second scan signal Sn2 are respectively supplied through the first scan line SL1 and the second scan line SL2, the switching thin film transistor T2 and the compensation thin film transistor T3 may be turned on in response to the first scan signal Sn1 and the second scan signal Sn2. In this case, the driving thin film transistor T1 may be diode-connected and forward-biased by the turned-on compensation thin film transistor T3. Then, a voltage compensated for a threshold voltage Vth of the driving thin film transistor T1 from the data signal Dm supplied from the data line DL may be applied to the gate electrode of the driving thin film transistor T1. The first power voltage ELVDD and a compensation voltage may be applied to both ends of the first storage capacitor Cst, and the charge corresponding to the voltage difference between both ends thereof may be stored in the first storage capacitor Cst.

In an emission period, the operation control thin film transistor T5 and the emission control thin film transistor T6 may be turned on by an emission control signal En supplied from the emission control line EL. A driving current may be generated based on the voltage difference between the first power voltage ELVDD and the voltage of the gate electrode of the driving thin film transistor T1, and the driving current may be supplied through the emission control thin film transistor T6 to the organic light emitting diode OLED connected to a second power voltage ELVSS.

In a second initialization period, when the next scan signal Sn+1 is supplied through the next scan line SLn, the second initialization thin film transistor T7 may be turned on in response to the next scan signal Sn+1 and the organic light emitting diode OLED may be initialized by the second initialization voltage Vint2 supplied from the second initialization voltage line VL2.

In an embodiment, at least one of the plurality of thin film transistors T1 to T7 in the pixel circuit PC may be provided as an oxide-based thin film transistor including an oxide semiconductor, and the others of the plurality of thin film transistors T1 to T7 in the pixel circuit PC may be provided as a silicon-based thin film transistor including a silicon semiconductor. In such an embodiment, the driving thin film transistor T1 directly affecting the brightness of the display apparatus may be configured as a silicon-based thin film transistor including a silicon semiconductor including polycrystalline silicon having high reliability, and accordingly, a high-resolution display apparatus may be implemented.

In such an embodiment, because an oxide semiconductor has a high carrier mobility and a low leakage current, a voltage drop thereof may not be great even when a driving time thereof is long. That is, low-frequency driving may be possible because a color change of an image due to a voltage drop may not be great even in the case of low-frequency driving. As such, because an oxide semiconductor has a small leakage current, at least one selected from the first initialization thin film transistor T4 and the compensation thin film transistor T3 connected to the gate electrode of the driving thin film transistor T1 may include an oxide semiconductor to reduce power consumption while preventing a leakage current that may flow to the gate electrode of the driving thin film transistor T1.

Hereinafter, for convenience of description, embodiments where the driving thin film transistor T1, the switching thin film transistor T2, the operation control thin film transistor T5, the emission control thin film transistor T6, and the second initialization thin film transistor T7 are provided as a silicon-based thin film transistor including a silicon semiconductor and the compensation thin film transistor T3 and the first initialization thin film transistor T4 are provided as an oxide-based thin film transistor including an oxide semiconductor will be described.

Figure 5:
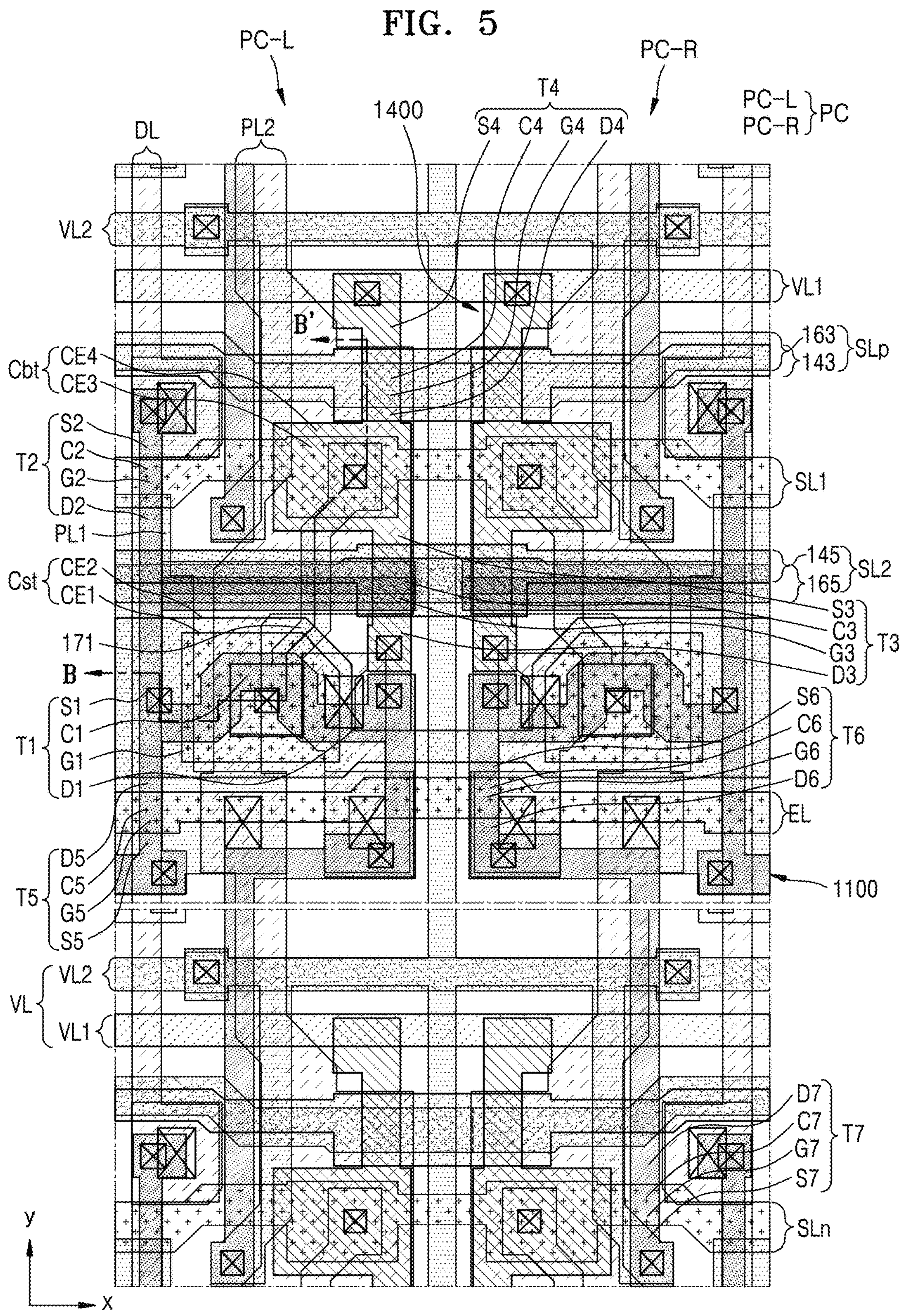
FIG. 5 is a plan view schematically illustrating a pair of pixel circuits of a display apparatus according to an embodiment.

FIG. 5 is a plan view schematically illustrating a pair of pixel circuits of a display apparatus according to an embodiment. Pixel circuits may be arranged in a matrix form with rows and columns, and FIG. 5 illustrates a pair of pixel circuits PC arranged in a same row and adjacent columns. As illustrated in FIG. 5, a pixel circuit PC-L arranged on the left side and a pixel circuit PC-R arranged on the right side may be horizontally symmetrical with each other.

The semiconductor layer of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may include a channel area and a source area and a drain area on opposing sides of the channel area, and the source area and the drain area may be understood as the source electrode and the drain electrode of the corresponding thin film transistor. The source area and the drain area may be interchanged with each other depending on the property of the transistor. Hereinafter, the terms "source area" and "drain area" will be used instead of the source electrode and the drain electrode.

Referring to FIG. 5, the driving thin film transistor T1, the switching thin film transistor T2, the operation control thin film transistor T5, the emission control thin film transistor T6, and the second initialization thin film transistor T7 may be arranged along a first semiconductor layer 1100, and the compensation thin film transistor T3 and the first initialization thin film transistor T4 may be arranged along a second semiconductor layer 1400.

The first semiconductor layer 1100 may be disposed on a substrate 100 (see FIG. 6) on which a buffer layer 111 (see FIG. 6) including an inorganic insulating material is disposed. In an embodiment, the first semiconductor layer 1100 may include low-temperature polysilicon (LTPS). Because the polysilicon material has high electron mobility (10 $cm^2/Vs$ or more), low energy consumption, and high reliability, the polysilicon material may be used as a semiconductor layer of a thin film transistor in a display apparatus. However, the disclosure is not limited thereto, and the first semiconductor layer 1100 may be formed of amorphous silicon (a-Si) and/or an oxide semiconductor.

Some areas of the first semiconductor layer 1100 may define or correspond to semiconductor layers of the driving thin film transistor T1, the switching thin film transistor T2, the operation control thin film transistor T5, the emission control thin film transistor T6, and the second initialization thin film transistor T7. In such an embodiment, the semiconductor layers of the driving thin film transistor T1, the switching thin film transistor T2, the operation control thin film transistor T5, the emission control thin film transistor T6, and the second initialization thin film transistor T7 may be connected to each other and may be bent in various shapes.

The second semiconductor layer 1400 may be disposed on a third gate insulating layer 117 (see FIG. 6) including an inorganic insulating material. In an embodiment, the second semiconductor layer 1400 may include an oxide semiconductor material. The oxide semiconductor material may include a Zn oxide-based material such as a Zn oxide, an In—Zn oxide, or a Ga—In—Zn oxide. In an embodiment, the oxide-based semiconductor layer may include an In—Ga—Zn—O (IGZO), In—Sn—Zn—O (ITZO), or In—Ga—Sn—Zn—O (IGTZO) semiconductor containing a metal such as indium (In), gallium (Ga), or stannum (Sn) in ZnO.

Some areas of the second semiconductor layer 1400 may define or correspond to semiconductor layers of the compensation thin film transistor T3 and the first initialization thin film transistor T4. In such an embodiment, the semiconductor layers of the compensation thin film transistor T3 and the first initialization thin film transistor T4 may be connected to each other. Because an oxide semiconductor has a high carrier mobility and a low leakage current, a voltage drop thereof may not be great even when a driving time thereof is long. That is, low-frequency driving may be possible because a color change of an image due to a voltage drop may not be great even in the case of low-frequency driving. As such, because an oxide semiconductor has a small leakage current, at least one selected form the first initialization thin film transistor T4 and the compensation thin film transistor T3 connected to the gate electrode of the driving thin film transistor T1 may include an oxide semiconductor to reduce power consumption while preventing a leakage current that may flow to the gate electrode of the driving thin film transistor T1.

The driving thin film transistor T1 may include a driving semiconductor layer and a first gate electrode G1. The driving semiconductor layer may include a first channel area C1 and a first source area S1 and a first drain area D1 on opposing sides of the first channel area C1. Because the driving semiconductor layer may have a curved shape, the first channel area C1 may be formed longer than the other channel areas C2 to C7. In an embodiment, for example, a relatively long channel length may be formed in a narrow space when the first channel area C1 has a shape that is bent multiple times, such as an '5,' 'M,' or 'W' shape. Because the first channel area C1 is formed relatively long, the driving range of a gate voltage applied to the first gate electrode G1 may widen and thus the gradation of light emitted from the organic light emitting diode OLED may be more finely controlled and the display quality thereof may be improved. In an embodiment, the first channel area C1 may be provided (disposed or formed) in a straight shape rather than a bent shape. The first gate electrode G1 may be provided in an isolated form to overlap the first channel area C1.

The first storage capacitor Cst may be arranged to overlap the driving thin film transistor T1. The first storage capacitor Cst may include a first electrode CE1 and a second electrode CE2. The first gate electrode G1 may function not only as a control electrode of the driving thin film transistor T1 but also as the first electrode CE1 of the first storage capacitor Cst. That is, the first gate electrode G1 may be integrally formed with the first electrode CE1 as a single unitary and indivisible unit. The second electrode CE2 of the first storage capacitor Cst may be provided to overlap the first electrode CE1 with an insulating layer therebetween, and in this case, the insulating layer may function as a dielectric layer of the first storage capacitor Cst.

The switching thin film transistor T2 may include a switching semiconductor layer and a second gate electrode G2. The switching semiconductor layer may include a second channel area C2 and a second source area S2 and a second drain area D2 on opposing sides of the second channel area C2. The second source area S2 may be electrically connected to the data line DL, and the second drain area D2 may be connected to the first source area S1. The second gate electrode G2 may be provided as or defined by a portion of the first scan line SL1.

The operation control thin film transistor T5 may include an operation control semiconductor layer and a fifth gate electrode G5. The operation control semiconductor layer may include a fifth channel area C5 and a fifth source area S5 and a fifth drain area D5 on opposing sides of the fifth channel area C5. The fifth source area S5 may be electrically connected to a first driving voltage line PL1, and the fifth drain area D5 may be connected to the first source area S1. The fifth gate electrode G5 may be provided as or defined by a portion of the emission control line EL.

The emission control thin film transistor T6 may include an emission control semiconductor layer and a sixth gate electrode G6. The emission control semiconductor layer may include a sixth channel area C6 and a sixth source area S6 and a sixth drain area D6 on opposing sides of the sixth channel area C6. The sixth source area S6 may be connected to the first drain area D1, and the sixth drain area D6 may be electrically connected to the pixel electrode of the organic light emitting diode OLED. The sixth gate electrode G6 may be provided as or defined by a portion of the emission control line EL.

The second initialization thin film transistor T7 may include a second initialization semiconductor layer and a seventh gate electrode G7. The second initialization semiconductor layer may include a seventh channel area C7 and a seventh source area S7 and a seventh drain area D7 on both sides of the seventh channel area C7. The seventh source area S7 may be electrically connected to the second initialization voltage line VL2, and the seventh drain area D7 may be connected to the sixth drain area D6. The seventh gate electrode G7 may be provided as or defined by a portion of the next scan line SLn.

A third gate insulating layer 117 (see FIG. 6) may be disposed on the driving thin film transistor T1, the switching thin film transistor T2, the operation control thin film transistor T5, the emission control thin film transistor T6, and the second initialization thin film transistor T7 including a silicon semiconductor, and the compensation thin film transistor T3 and the first initialization thin film transistor T4 including an oxide semiconductor may be disposed on the third gate insulating layer 117.

Each of the semiconductor layers of the compensation thin film transistor T3 and the first initialization thin film transistor T4 may include a channel area and a source area and a drain area on opposing sides of the channel area. In an embodiment, the source area and the drain area may be formed by controlling the carrier concentration of an oxide semiconductor to make it conductive. In an embodiment, for example, the source area and the drain area of the compensation thin film transistor T3 and the first initialization thin film transistor T4 may be formed by increasing the carrier concentration through plasma treatment using hydrogen (H)-based gas, fluorine (F)-based gas, or a combination thereof on the oxide semiconductor. The source area and the drain area may respectively correspond to the source electrode and the drain electrode. Hereinafter, the terms "source area" and "drain area" will be used instead of the source electrode and the drain electrode.

The compensation thin film transistor T3 may include a third gate electrode G3 and a compensation semiconductor layer including an oxide semiconductor material. The compensation semiconductor layer may include a third channel area C3 and a third source area S3 and a third drain area D3 on opposing sides of the third channel area C3. The third source area S3 may be bridge-connected to the first gate electrode G1 through a node connection line 171. Also, the third source area S3 may be connected to a fourth drain area D4 arranged in a same layer. The third drain area D3 may be electrically connected to a driving semiconductor layer A1 of the driving thin film transistor T1 and an emission control semiconductor layer A6 of the emission control thin film transistor T6. The third gate electrode G3 may be provided as or defined by a portion of the second scan line SL2.

The first initialization thin film transistor T4 may include a fourth gate electrode G4 and a first initialization semiconductor layer including an oxide semiconductor material. The first initialization semiconductor layer may include a fourth channel area C4 and a fourth source area S4 and a fourth drain area D4 on both sides of the fourth channel area C4. The fourth source area S4 may be electrically connected to the first initialization voltage line VL1, and the fourth drain area D4 may be bridge-connected to the first gate electrode G1 through the node connection line 171. The fourth gate electrode G4 may be provided as or defined by a portion of the previous scan line SLp.

A fourth gate insulating layer 119 (see FIG. 6) may be arranged between the compensation semiconductor layer and the third gate electrode G3 and between the first initialization semiconductor layer and the fourth gate electrode G4 to correspond to each channel area.

The third electrode CE3 of the second storage capacitor Cbt may be provided as or defined by a portion of the first scan line SL1 to be connected to the second gate electrode G2 of the switching thin film transistor T2. The fourth electrode CE4 of the second storage capacitor Cbt may be arranged to overlap the third electrode CE3 and may include an oxide semiconductor. The fourth electrode CE4 may be provided in a same layer as the compensation semiconductor layer of the compensation thin film transistor T3 and the first initialization semiconductor layer of the first initialization thin film transistor T4 and may be an area between the compensation semiconductor layer and the first initialization semiconductor layer. Alternatively, the fourth electrode CE4 may be provided to extend from the first initialization semiconductor layer. Alternatively, the fourth electrode CE4 may be provided to extend from the compensation semiconductor layer.

The node connection line 171 may be electrically connected to the first electrode CE1 and the compensation semiconductor layer of the compensation thin film transistor T3. The second electrode CE2 may be electrically connected to the first driving voltage line PL1, and the first driving voltage line PL1 may be electrically connected to a second driving voltage line PL2. The first driving voltage line PL1 and the second driving voltage line PL2 may extend in the second direction (y direction). The second electrode CE2 may extend in the first direction (x direction) to transmit the first power voltage ELVDD in the first direction (x direction). Accordingly, in the display area DA, a plurality of first driving voltage lines PL1 and second driving voltage lines PL2 and a plurality of second electrodes CE2 may form or collectively define a mesh structure.

In an embodiment, some of the lines may be provided as or defined by two conductive layers arranged in different layers from each other. In an embodiment, for example, the previous scan line SLp may include a lower scan line 143 and an upper scan line 163 arranged in different layers from each other. The lower scan line 143 may be provided in same layer and may include a same material as the second electrode CE2 of the first storage capacitor Cst. The lower scan line 143 may be arranged to at least partially overlap the upper scan line 163. The lower scan line 143 and the upper scan line 163 may correspond to a portion of the third gate electrode of the compensation thin film transistor T3, and the compensation thin film transistor T3 may have a double gate structure including control electrodes over and under a semiconductor layer respectively.

In an embodiment, the second scan line SL2 may include a lower scan line 145 and an upper scan line 165 arranged in different layers from each other. The lower scan line 145 may be provided in a same layer and may include a same material as the second electrode CE2 of the first storage capacitor Cst. The lower scan line 145 may be arranged to at least partially overlap the upper scan line 165. The lower scan line 145 and the upper scan line 165 may correspond to a portion of the fourth gate electrode G4 of the first initialization thin film transistor T4, and the first initialization thin film transistor T4 may have a double gate structure including control electrodes arranged over and under a semiconductor layer respectively.

An initialization voltage line VL may include a first initialization voltage line VIL1 and a second initialization voltage line VIL2 arranged on different layers. The first initialization voltage line VL1 may be provided in a same layer and may include the same material as the second electrode CE2 of the first storage capacitor Cst. The second initialization voltage line VL2 may be provided in a same layer and may include the same material as the first driving voltage line PL1.

Figure 6:
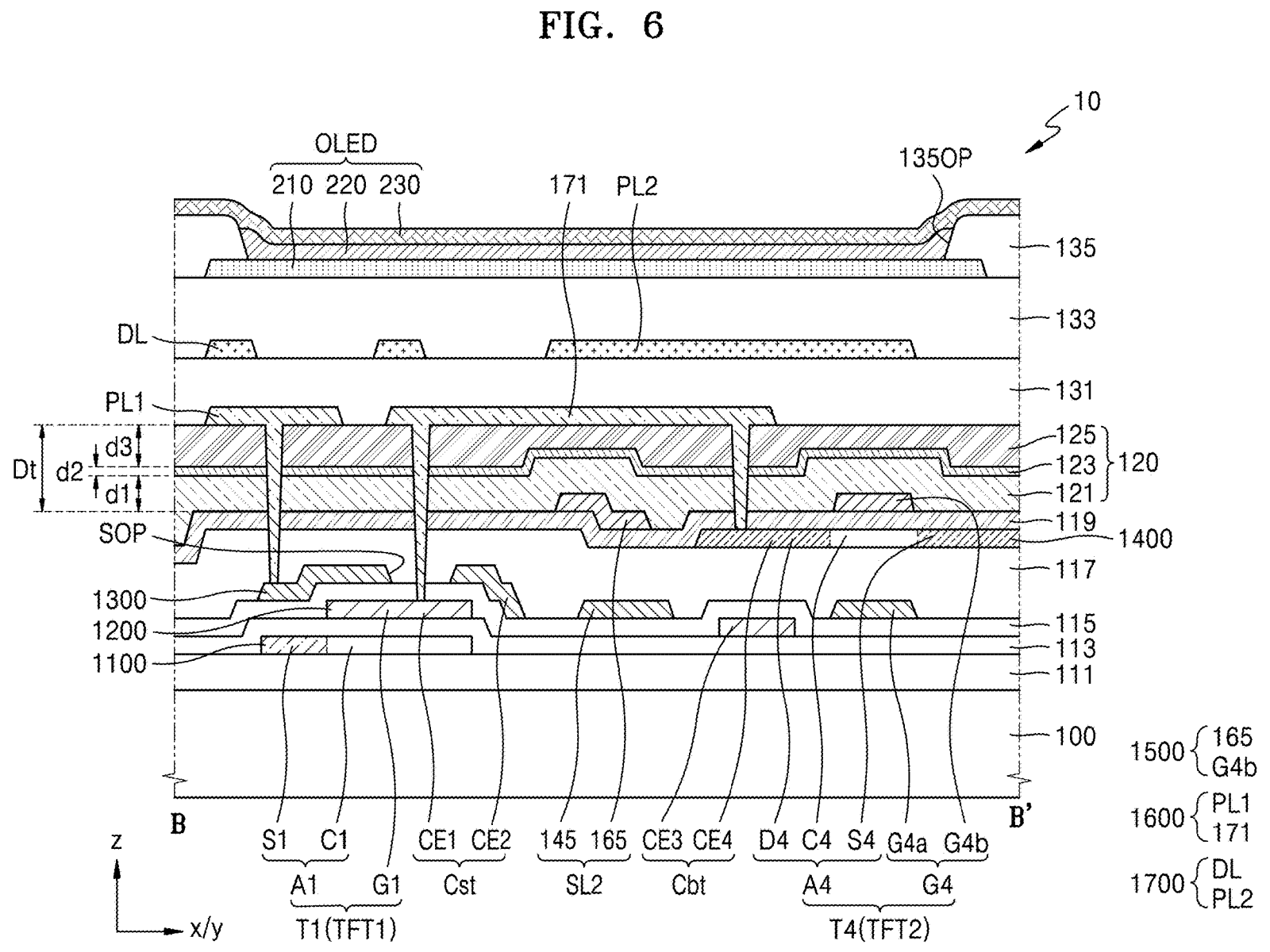

FIG. 6 is a cross-sectional view schematically illustrating a display apparatus according to an embodiment. FIG. 6 corresponds to a cross-sectional view of the display apparatus taken along line B-B' of FIG. 5.

Referring to FIG. 6, an embodiment of the display apparatus 10 may include a substrate 100. The substrate 100 may include a glass material, a ceramic material, a metal material, or a flexible or bendable material. In an embodiment, where the substrate 100 is flexible or bendable, the substrate 100 may include a first base layer, a first barrier layer, a second base layer, and a second barrier layer that are sequentially stacked one on another. The first base layer and the second base layer may include a polymer resin having a high heat resistance. In an embodiment, for example, the first base layer and the second base layer may include at least one selected from polyethersulfone, polyacrylate, polyether imide, polyethylene naphthalate, polyethylene terephthalate, polyphenylene sulfide, polyarylate, polyimide, polycarbonate, cellulose triacetate, cellulose acetate propionate, and polyaryleneethersulfone. In an embodiment, the first base layer and the second base layer may include polyimide.

The first barrier layer may be arranged between the first base layer and the second base layer. The first barrier layer may be disposed on the first base layer to reduce or block penetration of foreign substances, moisture, or external air from below.

The second barrier layer may be disposed on the second base layer. The second barrier layer may be disposed on the second base layer to reduce or block penetration of foreign substances, moisture, or external air from below.

The first barrier layer and the second barrier layer may include an inorganic insulating material such as silicon nitride ($SiN_x$), silicon oxide ($SiO_x$), silicon oxynitride ($SiO_xN_y$), aluminum oxide ($Al_2O_3$, titanium oxide ($TiO_2$), tantalum oxide ($Ta_2O_5$), hafnium oxide ($HfO_2$), or zinc oxide (ZnO). In an embodiment, the first barrier layer and the second barrier layer may include a same material as each other. In an embodiment, for example, the first barrier layer and the second barrier layer may include silicon oxide ($SiO_x$). In an embodiment, the first barrier layer and the second barrier layer may include different materials from each other. In an alternative embodiment, for example, the first barrier layer and/or the second barrier layer may be omitted.

A buffer layer 111 may be disposed on the substrate 100. The buffer layer 111 may be located on the substrate 100 to reduce or block penetration of foreign materials, moisture, or external air from below and may provide a flat upper surface thereon. The buffer layer 111 may include an inorganic insulating material such as silicon nitride ($SiN_x$), silicon oxide ($SiO_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO).

In an embodiment, the buffer layer 111 may include a first buffer layer and a second buffer layer. In an embodiment, the first buffer layer and the second buffer layer may include a same material as each other. In an embodiment, the first buffer layer and the second buffer layer may include different materials from each other.

A driving thin film transistor T1 (e.g., a first thin film transistor TFT1) and a first storage capacitor Cst may be disposed on the buffer layer 111. The first thin film transistor TFT1 may include a driving semiconductor layer A1 and a first gate electrode G1. The first storage capacitor Cst may include a first electrode CE1 and a second electrode CE2.

A first semiconductor layer 1100 (see FIG. 5) including semiconductor layers of a driving thin film transistor T1, a switching thin film transistor T2, an operation control thin film transistor T5, an emission control thin film transistor T6, and a second initialization thin film transistor T7 may be disposed on the buffer layer 111, and FIG. 6 illustrates a driving semiconductor layer A1 of the driving thin film transistor T1 that is defined by a portion of the first semiconductor layer 1100.

In an embodiment, the driving semiconductor layer A1 may be disposed on the buffer layer 111 and may include polysilicon. In an embodiment, the driving semiconductor layer A1 may include amorphous silicon. The driving semiconductor layer A1 may include a first channel area C1 and a first source area S1 doped with a dopant.

A first gate insulating layer 113 may be provided to cover the driving semiconductor layer A1. The first gate insulating layer 113 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The first gate insulating layer 113 may be defined by a single layer or multiple layers (i.e., have a single-layer structure or a multilayer structure), each layer therein including at least one selected from the above inorganic insulating materials.

A first metal layer 1200 including the gate electrodes of the driving thin film transistor T1, the switching thin film transistor T2, the operation control thin film transistor T5, the emission control thin film transistor T6, and the second initialization thin film transistor T7 may be disposed on the first gate insulating layer 113, and FIG. 6 illustrates a first gate electrode G1 of the driving thin film transistor T1. Also, the third electrode CE3 of the second storage capacitor Cbt and the emission control line EL (see FIG. 5) may be disposed on the first gate insulating layer 113.

The first metal layer 1200 including the first gate electrode G1 of the driving thin film transistor T1 and the third electrode CE3 of the second storage capacitor Cbt may be disposed on the first gate insulating layer 113. The first gate electrode G1 may be arranged to overlap the driving semiconductor layer A1, and the third electrode CE3 may be arranged to overlap a portion of a first initialization semiconductor layer A4. The first metal layer 1200 may include molybdenum (Mo), aluminum (Al), copper (Cu), titanium (Ti), or the like and may be defined by a single layer or multiple layers. In an embodiment, the first metal layer 1200 may include or defined by a single layer of molybdenum (Mo).

A second gate insulating layer 115 may be provided to cover the first metal layer 1200. The second gate insulating layer 115 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 115 may be defined by a single layer or multiple layers, each layer therein including at least one selected from the above inorganic insulating materials.

A second metal layer 1300 including the second electrode CE2 of the first storage capacitor Cst, the first initialization voltage line VL1 (see FIG. 5), the lower scan line 143 (see FIG. 5) of the previous scan line SLp (see FIG. 5), and the lower scan line 145 of the second scan line SL2 may be disposed over the second gate insulating layer 115. The second electrode CE2 of the first storage capacitor Cst may overlap the first gate electrode G1 of the driving thin film transistor T1 disposed thereunder. The first gate electrode G1 and the second electrode CE2 overlapping each other with the second gate insulating layer 115 therebetween may constitute the first storage capacitor Cst. In an embodiment, the first gate electrode G1 may be the first electrode CE1 of the first storage capacitor Cst. In an embodiment, the first electrode CE1 of the first storage capacitor Cst may be provided as or defined by a separate independent component.

In an embodiment, the second electrode CE2 may include, that is, the opening SOP is defined through the second electrode CE2. The opening SOP may be formed by removing a portion of the second electrode CE2 and may have a closed shape.

The lower scan line 145 of the second scan line SL2 may be arranged to at least partially overlap the upper scan line 165 of the second scan line SL2.

A portion of the lower scan line 143 of the previous scan line SLp overlapping the first initialization semiconductor layer A4 may function as a lower gate electrode G4*a* (e.g., a first gate electrode) of the first initialization thin film transistor T4.

In an embodiment, the second metal layer 1300 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may be defined by a single layer or multiple layers, each layer therein including at least one selected from the above material. In an embodiment, for example, the second metal layer 1300 may include molybdenum (Mo).

The third gate insulating layer 117 may be provided to cover the second electrode CE2. The third gate insulating layer 117 may include an inorganic insulating material such as silicon oxide ($SiO_x$), silicon nitride ($SiN_x$), silicon oxynitride ($SiO_xN_y$), aluminum oxide ($A_2O_3$), titanium oxide ($TiO_2$), tantalum oxide ($Ta_2O_5$), hafnium oxide ($HfO_2$), or zinc oxide ($ZnO_2$). The third gate insulating layer 117 may be defined by a single layer or multiple layers, each layer therein including at least one selected from the above inorganic insulating materials.

A first initialization thin film transistor T4 (e.g., a second thin film transistor TFT2) may be disposed on the third gate insulating layer 117. The second thin film transistor TFT2 may include a first initialization semiconductor layer A4 and an upper gate electrode G4*b* (e.g., a second gate electrode).

A second semiconductor layer 1400 may be disposed on the third gate insulating layer 117. The second semiconductor layer 1400 may include a Zn oxide-based material. In an embodiment, for example, the second semiconductor layer 1400 may include a Zn oxide, an In—Zn oxide, a Ga—In—Zn oxide, or the like. In an embodiment, the oxide-based semiconductor layer may include an IGZO, ITZO, or IGTZO semiconductor material containing a metal such as indium (In), gallium (Ga), or stannum (Sn) in ZnO.

The second semiconductor layer 1400 may include a channel area, a source area, and a drain area of each of the compensation thin film transistor T3 and the first initialization thin film transistor T4, and FIG. 6 illustrates the first initialization semiconductor layer A4 of the first initialization thin film transistor T4.

The second semiconductor layer 1400 may include the fourth electrode CE4 of the second storage capacitor Cbt, and for example, the fourth electrode CE4 may be provided as or defined by a portion of the first initialization semiconductor layer A4 of the first initialization thin film transistor T4. A second gate insulating layer 115 and a third gate insulating layer 117 may be arranged between the third electrode CE3 and the fourth electrode CE4 of the second storage capacitor Cbt, and the second gate insulating layer 115 and the third gate insulating layer 117 may function as a dielectric layer of the second storage capacitor Cbt.

A fourth gate insulating layer 119 may be provided on the second semiconductor layer 1400. The fourth gate insulating layer 119 may include an inorganic material including oxide or nitride. In an embodiment, for example, the fourth gate insulating layer 119 may include at least one selected from silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide (ZnO). In an embodiment, the fourth gate insulating layer 119 may include silicon nitride ($SiN_x$).

A third metal layer 1500 including the upper gate electrode G4*b* of the first initialization thin film transistor T4, the second initialization voltage line VL2 (see FIG. 5), the upper scan line 163 (see FIG. 5) of the previous scan line SLp (see FIG. 5), and the upper scan line 165 of the second scan line SL2 may be disposed on the fourth gate insulating layer 119. The third metal layer 1500 may include at least one of selected from (Mo), copper (Cu), and titanium (Ti) and may be defined by a single layer or multiple layers.

The upper gate electrode G4*b* of the first initialization thin film transistor T4 may be defined by a portion overlapping the second semiconductor layer 1400 in the upper scan line 163 of the previous scan line SLp. The upper gate electrode G4*b* of the first initialization thin film transistor T4 may overlap the lower gate electrode G4*a* of the first initialization thin film transistor T4, and the first initialization thin film transistor T4 may have a double gate structure in which a control electrode is provided over and under the first initialization semiconductor layer A4.

An interlayer insulating layer 120 may be disposed on the third metal layer 1500. In an embodiment, the interlayer insulating layer 120 may be arranged to cover the upper gate electrode G4*b* of the first initialization thin film transistor T4, the second initialization voltage line VL2 (see FIG. 5), the upper scan line 163 (see FIG. 5) of the previous scan line SLp (see FIG. 5), and the upper scan line 165 of the second scan line SL2.

At least one selected from the first metal layer 1200, the second metal layer 1300, and the third metal layer 1500 arranged under the interlayer insulating layer 120 may have a compressive stress or a tensile stress of about 200 MPa or less. In an embodiment, the first metal layer 1200, the second metal layer 1300, or the third metal layer 1500 may have a compressive stress or a tensile stress of about 200 MPa or less. In an alternative embodiment, the first metal layer 1200 and the second metal layer 1300 may have a compressive stress or a tensile stress of about 200 MPa or less, the first metal layer 1200 and the third metal layer 1500 may have a compressive stress or a tensile stress of 200 MPa or less, or the second metal layer 1300 and the third metal layer 1500 may have a compressive stress or a tensile stress of about 200 MPa or less. In another alternative embodiment, the first metal layer 1200, the second metal layer 1300, and the third metal layer 1500 may have a compressive stress or a tensile stress of about 200 MPa or less.

In an embodiment, at least one selected from the first metal layer 1200, the second metal layer 1300, and the third metal layer 1500 may be formed by using a rotary type sputtering device. Unlike a planar type sputtering device in which a ground voltage is applied only to an edge portion of a planar type target, the rotary type sputtering device may include a plurality of cylindrical targets arranged apart from each other with a ground portion, to which a ground voltage is applied, therebetween to improve the uniformity of a formed metal layer. Thus, the metal layer formed by using the rotary type sputtering device may have a compressive stress or a tensile stress of about 200 MPa or less because the density on the center portion and the density on the edge portion of the substrate 100 decrease. In an embodiment, the first metal layer 1200, the second metal layer 1300, or the third metal layer 1500 may be formed by using a rotary type sputtering device. In an alternative embodiment, the first metal layer 1200 and the second metal layer 1300 may be formed by using a rotary type sputtering device, the first metal layer 1200 and the third metal layer 1500 may be formed by using a rotary type sputtering device, or the second metal layer 1300 and the third metal layer 1500 may be formed by using a rotary type sputtering device. In another alternative embodiment, the first metal layer 1200, the second metal layer 1300, and the third metal layer 1500 may be formed by using a rotary type sputtering device.

In an embodiment, the interlayer insulating layer 120 may include an oxide layer 121, a first nitride layer 123 disposed on the oxide layer 121, and a second nitride layer 125 disposed on the first nitride layer 123.

The oxide layer 121 of the interlayer insulating layer 120 may include silicon oxide ($SiO_x$). In an embodiment, a thickness d1 of the oxide layer 121 may be about 3000 Å. The oxide layer 121 may be arranged to directly contact the third metal layer 1500.

The first nitride layer 123 and the second nitride layer 125 may include silicon nitride ($SiN_x$). In an embodiment, for example, a thickness d2 of the first nitride layer 123 may be about 500 Å. In an embodiment, the thickness d2 of the first nitride layer 123 may be in a range of about 400 Å to about 600 Å. The thickness d2 of the first nitride layer 123 may be less than a thickness d3 of the second nitride layer 125. In an embodiment, the thickness d3 of the second nitride layer 125 may be about 2500 Å. In an alternative embodiment, the thickness d3 of the second nitride layer 125 may be about 3500 Å. In an embodiment, the thickness d3 of the second nitride layer 125 may be in a range of about 2300 Å to about 3700 Å. A total thickness Dt of the interlayer insulating layer 120 may be in a range of about 5700 Å to about 7300 Å.

The first density of the first nitride layer 123 may be higher than the second density of the second nitride layer 125. In an embodiment, the hydrogen content of the first nitride layer 123 may be lower than the hydrogen content of the second nitride layer 125. Thus, the first nitride layer 123 may have a compressive stress, and the second nitride layer 125 may have a tensile stress. As the thickness Dt of the interlayer insulating layer 120 increases, the rigidity of the interlayer insulating layer 120 may increase and thus the impact resistance of the display apparatus 10 may be improved. The first nitride layer 123 may have a high density to effectively prevent penetration of external air such as moisture into the second semiconductor layer 1400; however, when the first nitride layer 123 is thick, the warpage of the substrate 100 in which the center portion of the substrate 100 rises more convexly than the edge portion thereof may occur due to the increase of a compressive stress. Thus, the warpage of the substrate 100 may be effectively prevented or reduced by forming the second nitride layer 125 having a second density lower than the first density of the first nitride layer 123 to be relatively thick.

A fourth metal layer 1600 including the first driving voltage line PL1 and the node connection line 171 may be disposed on the interlayer insulating layer 120. The fourth metal layer 1600 may include a material having a high conductivity, such as a metal or a conductive oxide. In an embodiment, for example, the fourth metal layer 1600 may be defined by a single layer or multiple layers, each layer therein including at least one selected from aluminum (Al), copper (Cu), and titanium (Ti).

The first driving voltage line PL1 may be connected to the second electrode CE2 of the first storage capacitor Cst through a contact hole defined or formed in the third gate insulating layer 117, the fourth gate insulating layer 119, and the interlayer insulating layer 120.

One end of the node connection line 171 may be connected to the first gate electrode G1 through a contact hole defined through the interlayer insulating layer 120, the fourth gate insulating layer 119, the third gate insulating layer 117, and the second gate insulating layer 115. The other end of the node connection line 171 may be connected to the second semiconductor layer 1400, for example, the fourth electrode CE4 of the second storage capacitor Cbt or the first initialization semiconductor layer A4, through a contact hole defined through the interlayer insulating layer 120.

A first planarization layer 131 may be disposed on the fourth metal layer 1600. A fifth metal layer 1700 including the data line DL and the second driving voltage line PL2 may be disposed on the first planarization layer 131. The fifth metal layer 1700 may include a material having a high conductivity, such as a metal or a conductive oxide. In an embodiment, for example, the fifth metal layer 1700 may is defined by a single layer or multiple layers, each layer therein including at least one selected from aluminum (Al), copper (Cu), and titanium (Ti).

A second planarization layer 133 may be disposed on the fifth metal layer 1700. The second planarization layer 133 may have a flat upper surface such that a pixel electrode 210 disposed thereover may be formed flat. The first planarization layer 131 and the second planarization layer 133 may include an organic material or an inorganic material and may have a single-layer structure or a multilayer structure. In an embodiment, for example, the first planarization layer 131 and the second planarization layer 133 may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or the like. in an embodiment, the first planarization layer 131 and the second planarization layer 133 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_2$), hafnium oxide ($HfO_2$), or zinc oxide (ZnO). In an embodiment, when the second planarization layer 133 is formed, after a layer (or an initial second planarization layer) is formed, chemical mechanical polishing may be performed on an upper surface of the layer to provide a flat upper surface.

An organic light emitting diode OLED including a pixel electrode 210, an intermediate layer 220, and an opposite electrode 230 may be disposed on the second planarization layer 133.

The pixel electrode 210 may be disposed on the second planarization layer 133. The pixel electrode 210 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. In an embodiment, for example, the pixel electrode 210 may have a structure including layers formed of ITO, IZO, ZnO, or $In_2O_3$ over/under the reflective layer described above. In such an embodiment, the pixel electrode 210 may have a stack structure of ITO/Ag/ITO, for example.

A pixel definition (or defining) layer 135 may be disposed on the second planarization layer 133. The pixel definition layer 135 may be disposed on the second planarization layer 133 and may cover the edge of the pixel electrode 210. An opening 135OP exposing at least a portion of the pixel electrode 210 may be defined in the pixel definition layer 135.

The pixel definition layer 135 may increase the distance between the edge of the pixel electrode 210 and the opposite electrode 230 over the pixel electrode 210 to prevent an arc or the like from occurring at the edge of the pixel electrode 210. The pixel definition layer 135 may include or be formed of an organic insulating material such as polyimide, polyimide, acrylic resin, benzocyclobutene, hexamethyldisiloxane (HMDSO), or phenol resin by spin coating or the like.

Although not illustrated, a spacer for preventing mask imprinting may be further disposed on the pixel definition layer 135. The spacer may be integrally formed with the pixel definition layer 135 as a single unitary and indivisible unit. In an embodiment, for example, the spacer and the pixel definition layer 135 may be simultaneously formed in a same process by using a halftone mask process.

The intermediate layer 220 may be arranged in the opening 135OP of the pixel definition layer 135 to correspond to the pixel electrode 210. The intermediate layer 220 may include an emission layer. The emission layer may include a high molecular weight organic material or a low molecular weight organic material and may emit red, green, blue, or white light.

In an embodiment, the intermediate layer 220 may further include an organic functional layer disposed over and/or under the emission layer. The organic functional layer may include a first functional layer and/or a second functional layer. In an embodiment, the first functional layer and/or the second functional layer may be omitted.

The first functional layer may be disposed under the emission layer. The first functional layer may be defined by a single layer or multiple layers, each layer therein including an organic material. The first functional layer may include a hole transport layer (HTL) having a single-layer structure. Alternatively, the first functional layer may include a hole injection layer (HIL) and an HTL.

The second functional layer may be disposed over the emission layer. The second functional layer may be defined by a single layer or multiple layers, each layer therein including an organic material. The second functional layer may include an electron transport layer (ETL) and/or an electron injection layer (EIL).

The opposite electrode 230 may be disposed on the intermediate layer 220. The opposite electrode 230 may include a conductive material having a low work function. In an embodiment, for example, the opposite electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 230 may further include a layer such as ITO, IZO, ZnO, or $In_2O_3$ on the (semi)transparent layer including at least one selected from the above materials.

In an embodiment, a capping layer (not illustrated) including an organic material may be formed on the opposite electrode 230. The capping layer may be provided to protect the opposite electrode 230 and improve light extraction efficiency. The capping layer may include an organic material having a higher refractive index than the opposite electrode 230. In an embodiment, the capping layer may include an inorganic material.

Although not illustrated in FIG. 6, the display apparatus 10 may include a thin film encapsulation layer 400 (see FIG. 2) shielding the organic light emitting diode OLED. The thin film encapsulation layer 400 may include at least one organic encapsulation layer and at least one inorganic encapsulation layer. The at least one organic encapsulation layer and the at least one inorganic encapsulation layer may be alternately stacked one on another.

In an embodiment, as described above with reference to FIG. 2, an input sensing member TSL and an optical functional member OFL may be disposed on the thin film encapsulation layer 400.

Figure 7:
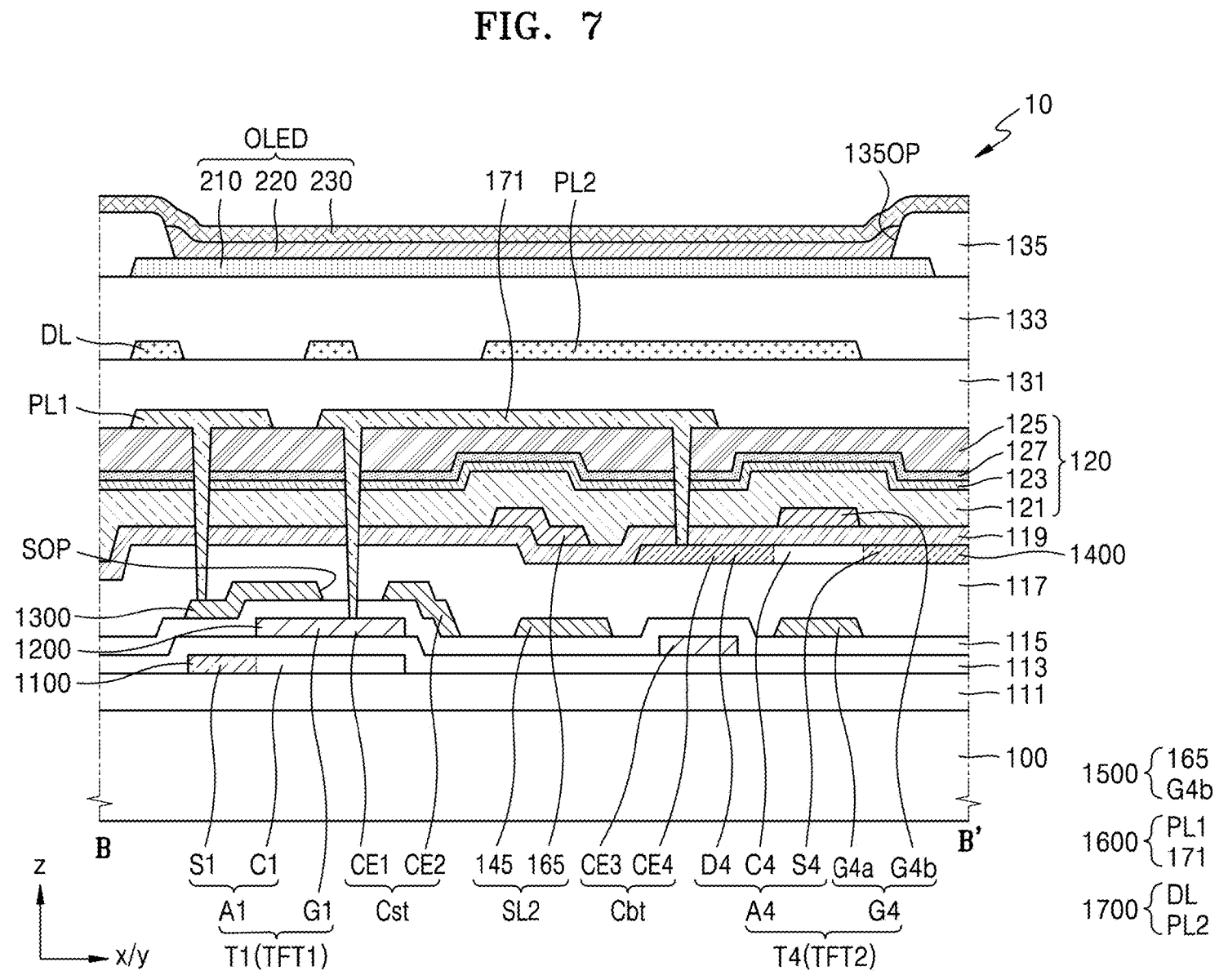

FIG. 7 is a cross-sectional view schematically illustrating a display apparatus according to an alternative embodiment.

The display apparatus 10 of FIG. 7 may be substantially the same as the display apparatus 10 of FIG. 6 except that a third nitride layer 127 is further arranged between the first nitride layer 123 and the second nitride layer 125 of the interlayer insulating layer 120. Hereinafter, any repetitive detailed descriptions of the same or similar components as those of the display apparatus 10 illustrated in FIG. 6 will be omitted or simplified, and the interlayer insulating layer 120 will be mainly described.

Referring to FIG. 7, the interlayer insulating layer 120 may be disposed on the third metal layer 1500 including the upper gate electrode G4*b* of the first initialization thin film transistor T4, the second initialization voltage line VL2 (see FIG. 5), the upper scan line 163 (see FIG. 5) of the previous scan line SLp (see FIG. 5), and the upper scan line 165 of the second scan line SL2.

In an embodiment, the interlayer insulating layer 120 may include an oxide layer 121, a first nitride layer 123, a second nitride layer 125, and a third nitride layer 127.

The oxide layer 121 of the interlayer insulating layer 120 may include silicon oxide ($SiO_x$). In an embodiment, the thickness of the oxide layer 121 may be about 3000 Å. The oxide layer 121 may be arranged to directly contact the third metal layer 1500.

In an embodiment, the first nitride layer 123 may be disposed on the oxide layer 121, the third nitride layer 127 may be disposed on the first nitride layer 123, and the second nitride layer 125 may be disposed on the third nitride layer 127.

The first nitride layer 123 to the third nitride layer 127 may include silicon nitride ($SiN_x$). The thickness of the first nitride layer 123 may be about 500 Å or less. The thickness of the first nitride layer 123 may be less than the thickness of the second nitride layer 125 and the third nitride layer 127. In an embodiment, the thickness of the second nitride layer 125 may be about 2500 Å. In an alternative embodiment, the thickness of the second nitride layer 125 may be about 3500 Å. In an embodiment, the thickness of the second nitride layer 125 may be in a range of about 2300 Å to about 3700 Å.

The first density of the first nitride layer 123 may be higher than the second density of the second nitride layer 125 and the third density of the third nitride layer 127. The second density of the second nitride layer 125 may be lower than the third density of the third nitride layer 127. In such an embodiment, the first density of the first nitride layer 123 closest to the oxide layer 121 may be highest, the second density of the second nitride layer 125 far from the oxide layer 121 may be lowest, and the third density of the third nitride layer 127 arranged between the first nitride layer 123 and the second nitride layers 125 may have a value between the first density and the second density.

In an embodiment, the hydrogen content of the first nitride layer 123 may be lower than the hydrogen content of the second nitride layer 125 and the hydrogen content of the third nitride layer 127. The hydrogen content of the second nitride layer 125 may be higher than the hydrogen content of the third nitride layer 127. In such an embodiment, the hydrogen content of the first nitride layer 123 close to the oxide layer 121 may be lowest, the hydrogen content of the second nitride layer 125 far from the oxide layer 121 may be highest, and the hydrogen content of the third nitride layer 127 arranged therebetween the first nitride layer 123 and the second nitride layer 125 may have a value between the hydrogen content of the first nitride layer 123 and the hydrogen content of the second nitride layer 125.

Thus, in such an embodiment, the first nitride layer 123 may have a compressive stress, the second nitride layer 125 may have a tensile stress, and the stress of the third nitride layer 127 arranged between the first nitride layer 123 and the second nitride layer 125 may have a value between the stress of the first nitride layer 123 and the stress of the second nitride layer 125.

FIG. 7 illustrates that a single third nitride layer 127 is arranged between the first nitride layer 123 and the second nitride layer 125; however, according to other embodiments, a plurality of nitride layers may be arranged between the first nitride layer 123 and the second nitride layer 125.

The density of the one or more nitride layers arranged between the first nitride layer 123 and the second nitride layer 125 may have a value between the first density of the first nitride layer 123 and the second density of the second nitride layer 125. In an embodiment, the one or more nitride layers arranged between the first nitride layer 123 and the second nitride layer 125 may have a higher density as they are closer to the first nitride layer 123 and may have a lower density as they are closer to the second nitride layer 125.

In such an embodiment, the hydrogen content of the nitride layers arranged between the first nitride layer 123 and the second nitride layer 125 may have a value between the hydrogen content of the first nitride layer 123 and the hydrogen content of the second nitride layer 125. In an embodiment, the nitride layers arranged between the first nitride layer 123 and the second nitride layer 125 may have a lower hydrogen content as being closer to the first nitride layer 123 and may have a higher hydrogen content as being closer to the second nitride layer 125.

In such an embodiment, by arranging the nitride layers having different densities or hydrogen contents from each other between the first nitride layer 123 and the second nitride layer 125, a lower stress may be applied toward the upper portion of the interlayer insulating layer 120. Thus, the warpage of the substrate 100 may be effectively prevented or reduced while increasing the thickness of the interlayer insulating layer 120.

Figure 8:
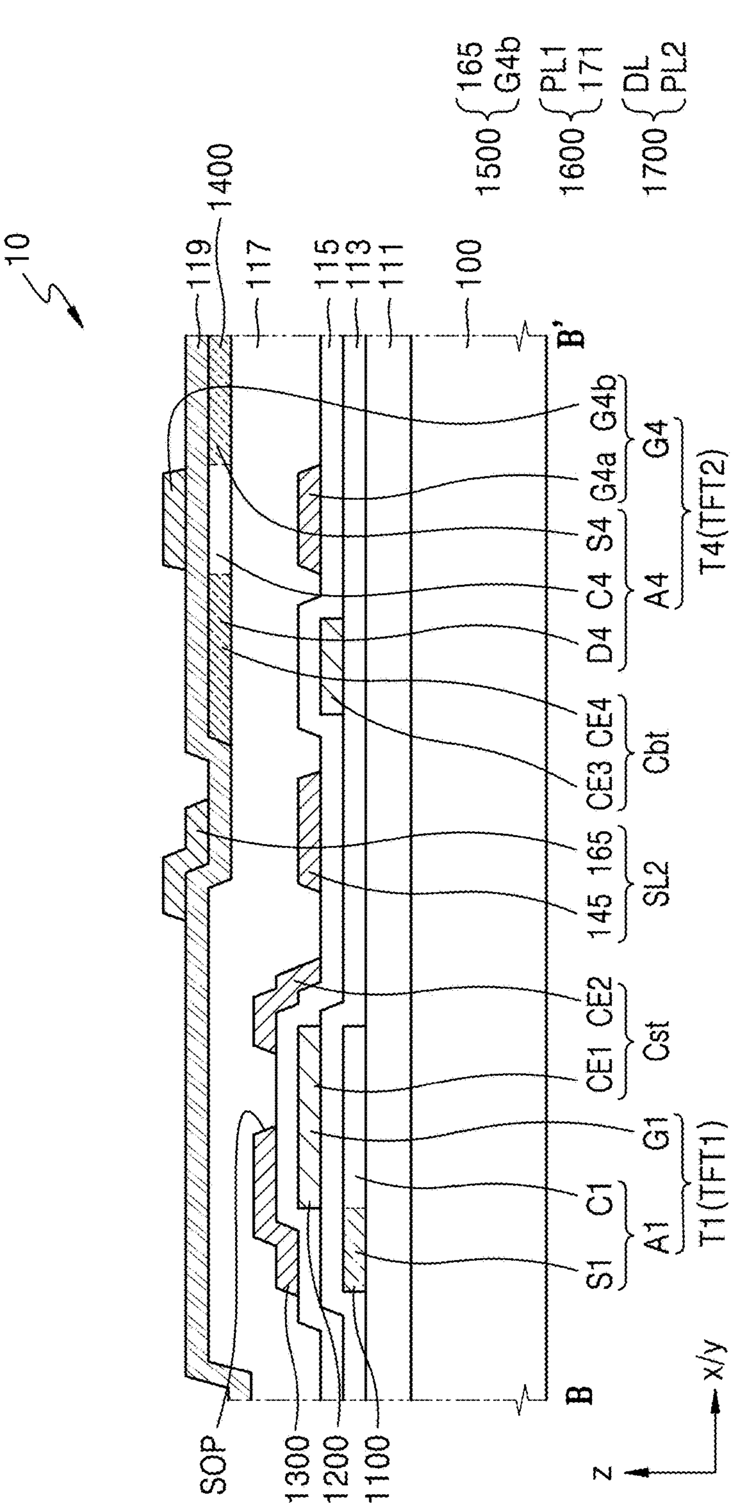
Figure 9:
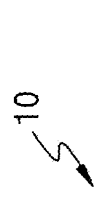
Figure 9:
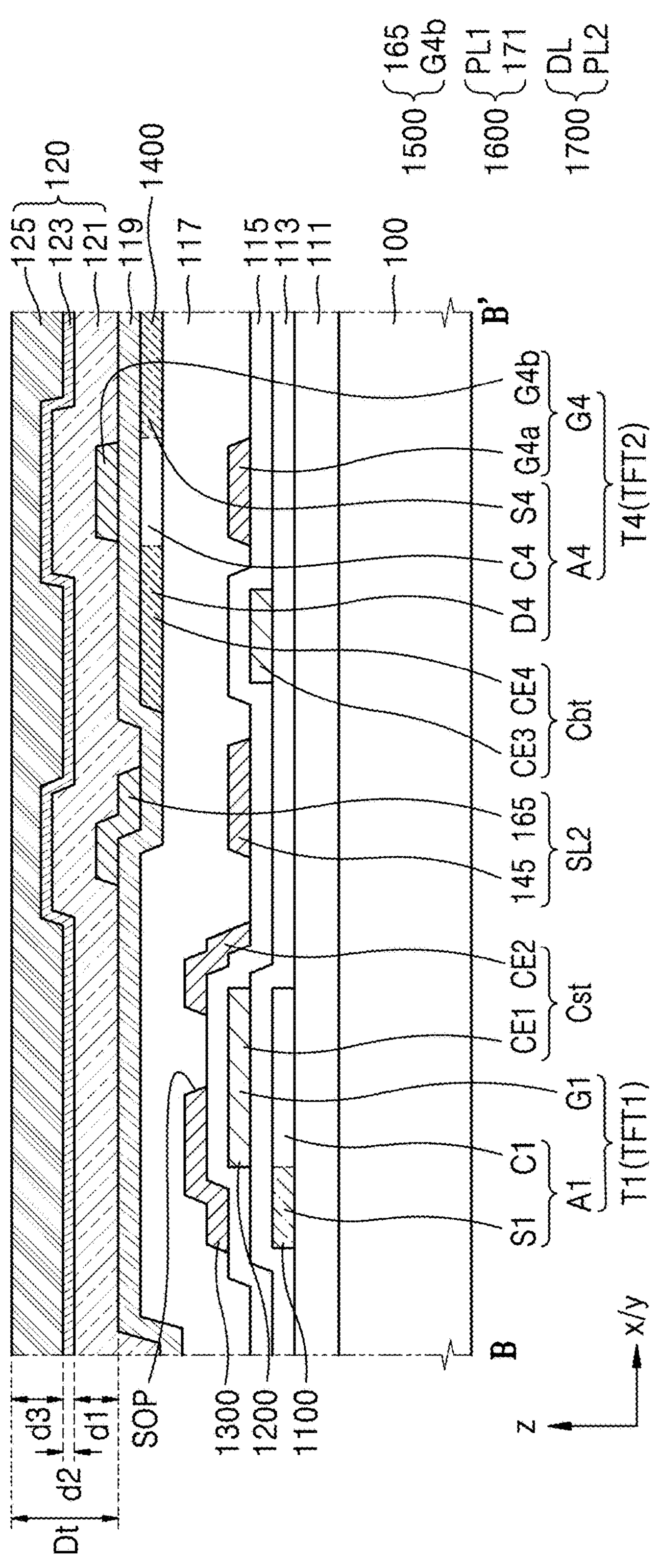

FIGS. 8 to 10 are cross-sectional views sequentially illustrating a method of manufacturing a display apparatus according to an embodiment.

Referring to FIGS. 8 to 10, first, transistors and storage capacitors may be formed (or provided) on a substrate 100. In such an embodiment, as shown in FIG. 8, a driving thin film transistor T1, a first initialization thin film transistor T4, a first storage capacitor Cst, and a second storage capacitor Cbt may be formed on the substrate 100. In an embodiment, a buffer layer 111 may be formed before the transistors and storage capacitors are formed on the substrate 100.

A first semiconductor layer 1100 may be formed on the buffer layer 111. The first semiconductor layer 1100 may include low-temperature polysilicon. A partial area of the first semiconductor layer 1100 may correspond to a driving semiconductor layer A1 of the driving thin film transistor T1.

A first gate insulating layer 113 may be formed on the first semiconductor layer 1100. The first gate insulating layer 113 may be formed to entirely cover the substrate 100.

A first metal layer 1200 may be formed on the first gate insulating layer 113. The first metal layer 1200 may include a first gate electrode G1 of the driving thin film transistor T1 and a third electrode CE3 of the second storage capacitor Cbt. The first metal layer 1200 may include molybdenum (Mo), aluminum (Al), copper (Cu), titanium (Ti), or the like and may be defined by a single layer or multiple layers. In an embodiment, the first metal layer 1200 may be defined by a single layer of molybdenum (Mo). In an embodiment, the first metal layer 1200 may have a compressive stress or a tensile stress of about 200 MPa or less.

A second gate insulating layer 115 may be formed on the first metal layer 1200. The second gate insulating layer 115 may be formed to entirely cover the substrate 100.

A second metal layer 1300 may be formed on the second gate insulating layer 115. The second metal layer 1300 may include a second electrode CE2 of the first storage capacitor Cst and a lower scan line 145 of the second scan line SL2. The second metal layer 1300 may include molybdenum (Mo), aluminum (Al), copper (Cu), titanium (Ti), or the like and may be defined by a single layer or multiple layers. In an embodiment, the second metal layer 1300 may include or be defined by a single layer of molybdenum (Mo). In an embodiment, the second metal layer 1300 may have a compressive stress or a tensile stress of about 200 MPa or less.

A third gate insulating layer 117 may be formed on the second metal layer 1300. The third gate insulating layer 117 may be formed to entirely cover the substrate 100.

A second semiconductor layer 1400 may be formed on the third gate insulating layer 117. The second semiconductor layer 1400 may include an oxide semiconductor material. The oxide semiconductor material may include a Zn oxide-based material such as a Zn oxide, an In—Zn oxide, or a Ga—In—Zn oxide. In an embodiment, the oxide-based semiconductor layer may include an IGZO, ITZO, or IGTZO semiconductor containing a metal such as indium (In), gallium (Ga), or stannum (Sn) in ZnO. A partial area of the second semiconductor layer 1400 may correspond to a first initialization semiconductor layer of the first initialization thin film transistor T4.

A fourth gate insulating layer 119 may be formed on the second semiconductor layer 1400. In an embodiment, the fourth gate insulating layer 119 may be formed to entirely cover the substrate 100. In an alternative embodiment, the fourth gate insulating layer 119 may be patterned to respectively correspond to the second initialization voltage line VL2 (see FIG. 5) disposed thereover, the upper scan line 163 (see FIG. 5) of the previous scan line SLp (see FIG. 5), and the upper scan line 165 of the second scan line SL2.

A third metal layer 1500 may be formed on the fourth gate insulating layer 119. The third metal layer 1500 may include the upper gate electrode G4*b* of the first initialization thin film transistor T4 and the upper scan line 165 of the second scan line SL2. The third metal layer 1500 may include at least one selected from molybdenum (Mo), copper (Cu), and titanium (Ti) and may be defined by a single layer or multiple layers. In an embodiment, the third metal layer 1500 may have a compressive stress or a tensile stress of about 200 MPa or less.

In an embodiment, any one of the first metal layer 1200, the second metal layer 1300, and the third metal layer 1500 may be formed by using a rotary type sputtering device. Because the metal layer formed by using the rotary type sputtering device has an improved uniformity, after an interlayer insulating layer 120 (see FIG. 9) is formed, the warpage of the substrate 100 caused by the stress of the interlayer insulating layer 120 may be effectively prevented or reduced.

Referring to FIG. 9, an interlayer insulating layer 120 may be formed on the third metal layer 1500. The interlayer insulating layer 120 may include an oxide layer and a plurality of nitride layers. In an embodiment, as shown in FIG. 9, the interlayer insulating layer 120 may include a single oxide layer 121, a first nitride layer 123, and a second nitride layer 125; however, the disclosure is not limited thereto. In an alternative embodiment, the interlayer insulating layer 120 may include a plurality of nitride layers arranged between the first nitride layer 123 and the second nitride layer 125.

The oxide layer 121 may include silicon oxide ($SiO_x$). In an embodiment, a thickness d1 of the oxide layer 121 may be about 3000 Å.

The first nitride layer 123 and the second nitride layer 125 may be sequentially formed on the oxide layer 121. The first nitride layer 123 and the second nitride layer 125 may include silicon nitride ($SiN_x$). In a process of forming the first nitride layer 123 and the second nitride layer 125, the hydrogen partial pressure in the chamber when the first nitride layer 123 is formed may be maintained lower than the hydrogen partial pressure in the chamber when the second nitride layer 125 is formed, and accordingly, the first density that is the density of the first nitride layer 123 may be higher than the second density that is the density of the second nitride layer 125. In such an embodiment, the hydrogen content of the first nitride layer 123 may be lower than the hydrogen content of the second nitride layer 125.

In an embodiment, as described above, the nitride layers having different densities from each other may be formed between the first nitride layer 123 and the second nitride layer 125. In an embodiment, the respective nitride layers may be continuously formed by increasing the hydrogen partial pressure gradually from the hydrogen partial pressure in the chamber in the process of forming the first nitride layer 123 to the hydrogen partial pressure in the chamber in the process of forming the second nitride layer 125.

A thickness d2 of the first nitride layer 123 may be about 500 Å. In an embodiment, the thickness d2 of the first nitride layer 123 may be in a range of about 400 Å to about 600 Å. The thickness d2 of the first nitride layer 123 may be less than a thickness d3 of the second nitride layer 125. In an embodiment, the thickness d3 of the second nitride layer 125 may be about 2500 Å. In an alternative embodiment, the thickness d3 of the second nitride layer 125 may be about 3500 Å. In an embodiment, the thickness d3 of the second nitride layer 125 may be in a range of about 2300 Å to about 3700 Å. A total thickness Dt of the interlayer insulating layer 120 may be in a range of about 5700 Å to about 7300 Å.

In an embodiment, the first nitride layer 123 formed in a low hydrogen atmosphere may have a stress of about −435 MPa, and the second nitride layer 125 formed in a high hydrogen atmosphere may have a stress of about 170 MPa. Thus, a compressive stress may be applied to the first nitride layer 123, and a tensile stress may be applied to the second nitride layer 125. In such an embodiment, the second nitride layer 125 may be allowed to be formed thick on the first nitride layer 123, such that the warpage of the substrate 100 in which the center portion of the substrate 100 rises more convexly than the edge portion thereof due to the interlayer insulating layer 120 may be effectively prevented or reduced.

Referring to FIG. 10, a fourth metal layer 1600 may be formed on the interlayer insulating layer 120. The fourth metal layer 1600 may include a first driving voltage line PL1 and a node connection line 171. The fourth metal layer 1600 may include a material having a high conductivity, such as a metal or a conductive oxide. In an embodiment, for example, the fourth metal layer 1600 may be defined by a single layer or multiple layers, each layer therein including at least one selected from aluminum (Al), copper (Cu), and titanium (Ti).

Before the forming of the fourth metal layer 1600, contact holes may be formed through the interlayer insulating layer 120, the fourth gate insulating layer 119, the third gate insulating layer 117 and the second gate insulating layer 115, and contact holes may be formed through the interlayer insulating layer 120, the fourth gate insulating layer 119, the third gate insulating layer 117, the second gate insulating layer 115 and the first gate insulating layer 113. In an embodiment, the substrate 100 may be moved by air pressure to form such contact holes. The warpage of the substrate 100 may prevent the movement of the substrate 100 using air pressure and thus a contact hole defect may occur. In such an embodiment, as described above, the interlayer insulating layer 120 includes at least one oxide layer 121 and the first nitride layer 123 and the second nitride layer 125 having different densities from each other, such that the warpage of the substrate 100 may be effectively prevented or reduced and thus the contact hole defect may also be reduced.

A first planarization layer 131, a fifth metal layer 1700, and a second planarization layer 133 may be sequentially formed on the fourth metal layer 1600. The first planarization layer 131 and the second planarization layer 133 may include an organic material or an inorganic material and may have a single-layer structure or a multilayer structure. The second planarization layer 133 may have a flat upper surface such that a pixel electrode 210 disposed thereover may be formed flat.

An organic light emitting diode OLED including a pixel electrode 210, an intermediate layer 220, and an opposite electrode 230 may be formed on the second planarization layer 133.

Figure 11:
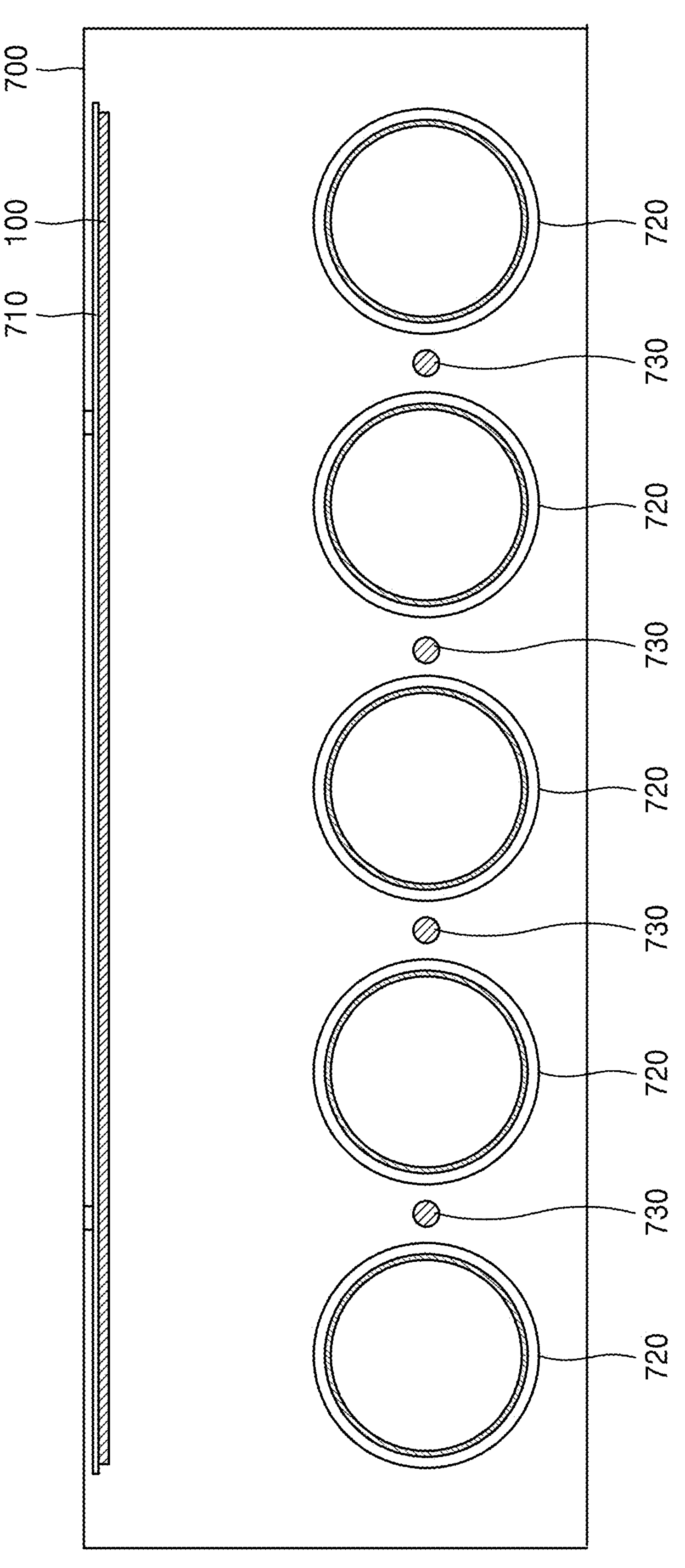
FIG. 11 is a diagram schematically illustrating an operation of forming a metal layer according to an embodiment.

FIG. 11 is a diagram schematically illustrating an operation of forming a metal layer according to an embodiment.

Referring to FIG. 11, in an embodiment, at least one selected from the first metal layer 1200 (see FIG. 6), the second metal layer 1300 (see FIG. 6), and the third metal layer 1500 (see FIG. 6) may be formed by using a rotary type sputtering device 700 as illustrated in FIG. 11.

The rotary type sputtering device 700 may include a support unit 710 for supporting the substrate 100, a plurality of cylindrical targets 720, and a plurality of ground units 730.

The substrate 100 may be fixed to the support unit 710. The support unit 710 may prevent the substrate 100 from moving or shaking while a deposition process is performed on the substrate 100.

The cylindrical targets 720 may be arranged apart from each other. In the deposition process, each of the cylindrical targets 720 may rotate to provide a deposition material on the substrate 100.

The ground units 730 that are grounded or provide ground power may be arranged between the cylindrical targets 720. Thus, the rotary type sputtering device 700 may form plasma having an improved uniformity distribution over the entire surface of the substrate 100 in the deposition process.

In an embodiment, at least one selected from the first metal layer 1200 (see FIG. 6), the second metal layer 1300 (see FIG. 6), and the third metal layer 1500 (see FIG. 6) may be formed by using the rotary type sputtering device 700, such that the difference between stresses applied to a portion formed on the center portion of the substrate 100 and a portion formed on the edge portion of the substrate 100 may be reduced. Thus, after the interlayer insulating layer 120 (see FIG. 6) is formed, the warpage of the substrate 100 caused by the stress of the interlayer insulating layer 120 may be effectively prevented or reduced.

Figure 12:
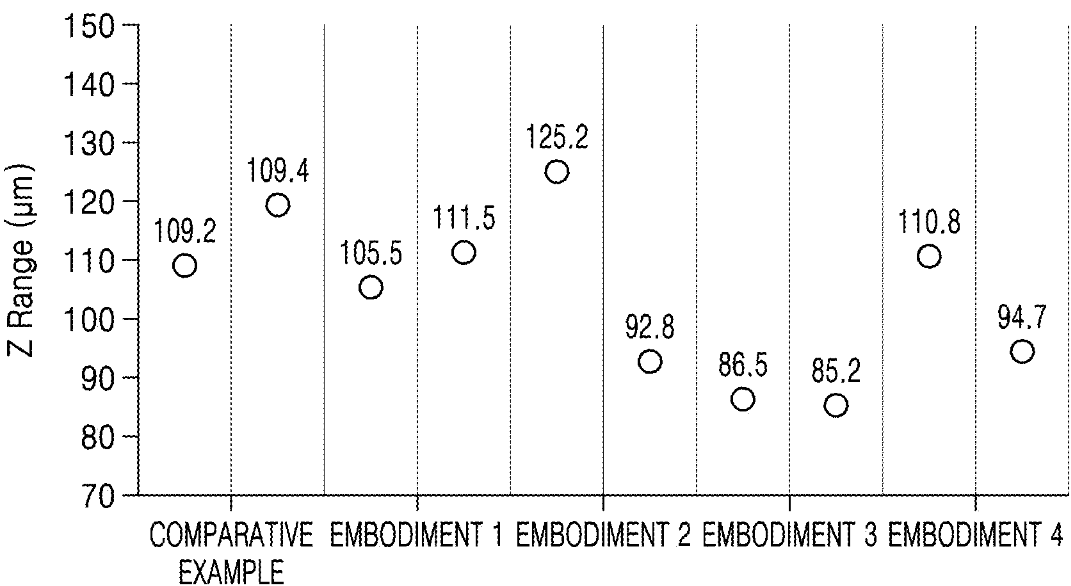
FIG. 12 is a graph illustrating the heights of upper surfaces of display apparatuses according to a comparative example and embodiments.

FIG. 12 is a graph illustrating the difference between the heights of the upper surfaces of display apparatuses according to a comparative example and embodiments.

In the comparative example, an interlayer insulating layer may include an oxide layer having a thickness of about 3000 Å and a nitride layer having a thickness of 2000 Å. In Embodiment 1, an interlayer insulating layer may include an oxide layer having a thickness of about 3000 Å, a first nitride layer having a thickness of about 500 Å, and a second nitride layer having a thickness of about 2500 Å and having a second density higher than the first density of the first nitride layer. In Embodiment 2, an interlayer insulating layer may include an oxide layer having a thickness of about 3000 Å, a first nitride layer having a thickness of about 500 Å, and a second nitride layer having a thickness of about 3500 Å and having a second density higher than the first density of the first nitride layer. Each of the first metal layer, the second metal layer, and the third metal layer of the comparative example, Embodiment 1, and Embodiment 2 was formed by using a planar type sputtering device.

In Embodiment 3, an interlayer insulating layer may include an oxide layer having a thickness of about 3000 Å, a first nitride layer having a thickness of about 500 Å, and a second nitride layer having a thickness of about 2500 Å and having a second density higher than the first density of the first nitride layer. In Embodiment 4, an interlayer insulating layer may include an oxide layer having a thickness of about 3000 Å, a first nitride layer having a thickness of about 500 Å, and a second nitride layer having a thickness of about 3500 Å and having a second density higher than the first density of the first nitride layer. The second metal layer and the third metal layer of Embodiment 3 and Embodiment 4 were formed by using a rotary type sputtering device.

FIG. 12 illustrates a Z range value based on the height difference obtained by measuring the height from the upper surface of the stage that supports the substrate to the upper surface of the interlayer insulating layer of the display apparatus at various points.

When the Z range value is 150 μm or more, a contact hole defect may occur due to the warpage of the substrate. Referring to Embodiments 1 and 2, it may be seen that the Z range value is similar or further decreases even when the thickness of the interlayer insulating layer increases by about 1000 Å to about 2000 Å.

Referring to Embodiments 3 and 4, it may be seen that the Z range value is further reduced by adjusting the stress of the second metal layer and the third metal layer by forming the second metal layer and the third metal layer with a rotary type sputtering device.

Thus, in the display apparatus according to embodiments, the defect rate due to the warpage of the substrate may be reduced while improving the impact resistance by increasing the thickness of the interlayer insulating layer.

In the display apparatus according to embodiments, a dark spot may not occur in spite of an external impact applied thereto.

The display apparatus according to embodiments may be freely changed in shape and, when the shape is being changed, the display apparatus may prevent some of the internal layers thereof from being broken or damaged.

The display apparatus according to embodiments may effectively handle an external impact applied thereto.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
a substrate;
a first semiconductor layer disposed on the substrate;
a second semiconductor layer disposed on the first semiconductor layer;
a first metal layer disposed on the first semiconductor layer;
a second metal layer arranged between the first metal layer and the second semiconductor layer;
a third metal layer arranged therebetween the second semiconductor layer and the interlayer insulating layer;
an interlayer insulating layer disposed on the second semiconductor layer and the third metal layer, wherein the interlay insulating layer includes a plurality of inorganic insulating layers;
a source electrode or a drain electrode disposed on the interlayer insulating layer and respectively connected to the first semiconductor layer or the second semiconductor layer; and
an organic light emitting element connected to the source electrode or the drain electrode,
wherein at least one selected from the first to third metal layers has a compressive stress or a tensile stress of about 200 MPa or less,
wherein the plurality of inorganic insulating layers include an oxide layer, a first nitride layer disposed on the oxide layer and having a first density, and a second nitride layer disposed on the first nitride layer and having a second density lower than the first density, and
wherein a hydrogen content of the first nitride layer is lower than a hydrogen content of the second nitride layer.

2. The display apparatus of claim 1, wherein
the first nitride layer has a compressive stress, and
the second nitride layer has a tensile stress.

3. The display apparatus of claim 1, wherein a thickness of the first nitride layer is less than a thickness of the oxide layer.

4. The display apparatus of claim 3, wherein the thickness of the first nitride layer is less than a thickness of the second nitride layer.

5. The display apparatus of claim 3, wherein
a thickness of the interlayer insulating layer is in a range of about 5500 Å to about 7500 Å, and
the thickness of the first nitride layer is in a range of about 400 Å to about 600 Å.

6. A display apparatus comprising:
a substrate;
a first semiconductor layer disposed on the substrate;
a second semiconductor layer disposed on the first semiconductor layer;
an interlayer insulating layer disposed on the second semiconductor layer and including a plurality of inorganic insulating layers;
a source electrode or a drain electrode disposed on the interlayer insulating layer and respectively connected to the first semiconductor layer or the second semiconductor layer; and
an organic light emitting element connected to the source electrode or the drain electrode,
wherein the plurality of inorganic insulating layers comprise:
an oxide layer;
a first nitride layer disposed on the oxide layer and having a first density;
a second nitride layer disposed on the first nitride layer and having a second density lower than the first density; and
a third nitride layer arranged between the first nitride layer and the second nitride layer, and having a third density lower than the first density and higher than the second density.

7. The display apparatus of claim 6, wherein
a hydrogen content of the third nitride layer is higher than a hydrogen content of the first nitride layer and is lower than a hydrogen content of the second nitride layer.

8. A method of manufacturing a display apparatus, the method comprising:
providing a first semiconductor layer on a substrate;
providing a second semiconductor layer on the first semiconductor layer;
providing a first metal layer on the first semiconductor layer between the forming of the first semiconductor layer and the forming of the second semiconductor layer;
providing a second metal layer on the first metal layer; and
providing a third metal layer on the second semiconductor layer between the providing the second semiconductor layer and the providing the interlayer insulating layer; and
providing an interlayer insulating layer including a plurality of inorganic insulating layers on the second semiconductor layer and the third metal layer,
wherein at least one selected from the first to third metal layers has a compressive stress or a tensile stress of about 200 MPa or less, and
wherein the providing the interlayer insulating layer comprises:
providing an oxide layer on the second semiconductor layer;
providing a first nitride layer having a first density on the at least one oxide layer; and
providing a second nitride layer having a second density lower than the first density on the first nitride layer,
wherein a hydrogen content of the first nitride layer is lower than a hydrogen content of the second nitride layer.

9. The method of claim 8, wherein a hydrogen partial pressure in a chamber used in the providing the first nitride layer is lower than a hydrogen partial pressure in the chamber used in the providing the second nitride layer.

10. The method of claim 8, wherein the first nitride layer has a thickness in a range of about 400 Å to about 600 Å.

11. The method of claim 10, wherein the interlayer insulating layer has a thickness in a range of about 5500 Å to about 7500 Å.

12. The method of claim 8, further comprising:
providing a third nitride layer having a third density lower than the first density and higher than the second density between the providing the first nitride layer and the providing the second nitride layer.

13. The method of claim 12, wherein a hydrogen partial pressure in a chamber used in the providing the third nitride layer is higher than a hydrogen partial pressure in the chamber used in the providing the first nitride layer and is lower than a hydrogen partial pressure in the chamber used in the providing the second nitride layer.

14. The method of claim 8, wherein at least one selected from the providing the first metal layer, the providing the second metal layer, and the providing the third metal layer is performed by using a rotary type sputtering device including a plurality of cylindrical targets.

15. The method of claim 14, wherein the plurality of cylindrical targets is arranged apart from each other with a ground portion therebetween.

16. The method of claim 8, wherein the substrate is disposed on a stage which supports the substrate, and a difference between a height from an upper surface of the stage to a top surface of the interlayer insulating layer, which is measured at a center portion of the substrate, and a height from the upper surface of the stage to the top surface of the interlayer insulating layer, which is measured at an edge portion of the substrate, is about 150 μm or less.

* * * * *